United States Patent
Cui

(10) Patent No.: US 9,853,038 B1
(45) Date of Patent: Dec. 26, 2017

(54) THREE-DIMENSIONAL MEMORY DEVICE HAVING INTEGRATED SUPPORT AND CONTACT STRUCTURES AND METHOD OF MAKING THEREOF

(71) Applicant: SANDISK TECHNOLOGIES LLC, Plano, TX (US)

(72) Inventor: Zhixin Cui, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/411,126

(22) Filed: Jan. 20, 2017

(51) Int. Cl.
| H01L 27/115 | (2017.01) |
| H01L 27/11556 | (2017.01) |
| H01L 27/11524 | (2017.01) |
| H01L 27/11582 | (2017.01) |
| H01L 27/1157 | (2017.01) |

(52) U.S. Cl.
CPC .... *H01L 27/11556* (2013.01); *H01L 27/1157* (2013.01); *H01L 27/11524* (2013.01); *H01L 27/11582* (2013.01)

(58) Field of Classification Search
CPC ........... H01L 27/11556; H01L 27/1157; H01L 27/11524; H01L 27/11582
See application file for complete search history.

(56) References Cited

U.S. PATENT DOCUMENTS

| 5,915,167 A | 6/1999 | Leedy |
| 8,178,919 B2 * | 5/2012 | Fujiwara ........... H01L 27/11524 257/319 |
| 8,395,190 B2 | 3/2013 | Shim et al. |
| 9,412,749 B1 | 8/2016 | Shimabukuro et al. |
| 9,455,267 B2 | 9/2016 | Zhang et al. |
| 2006/0110880 A1 | 5/2006 | Yuan |
| 2010/0133598 A1 | 6/2010 | Chae et al. |
| 2010/0213527 A1 | 8/2010 | Shim et al. |
| 2010/0254191 A1 | 10/2010 | Son et al. |
| 2011/0198687 A1 | 8/2011 | Lee |
| 2011/0248327 A1 | 10/2011 | Son et al. |
| 2012/0098050 A1 | 4/2012 | Shim et al. |
| 2014/0042519 A1 | 2/2014 | Lee |

(Continued)

OTHER PUBLICATIONS

U.S. Appl. No. 14/989,206, filed Jan. 6, 2016, SanDisk Technologies LLC.

(Continued)

*Primary Examiner* — David Vu
(74) *Attorney, Agent, or Firm* — The Marbury Law Group PLLC

(57) ABSTRACT

Memory openings and support openings are formed through an alternating stack of insulating layers and sacrificial material layers over a substrate. The support openings are laterally expanded by laterally recessing the insulating layers with respect to the sacrificial material layers. The laterally expanded support openings are filled with a combination of a dielectric material and a sacrificial fill material to form support pillar structures. After forming memory films and channels in the memory openings, the sacrificial material layers are replaced with electrically conductive layers while the support pillar structures provide structural support to the insulating layers. The sacrificial fill material is replaced with contact via structures to form integrated support and contact structures.

11 Claims, 34 Drawing Sheets

(56) References Cited

U.S. PATENT DOCUMENTS

| | | |
|---|---|---|
| 2014/0092686 A1 | 4/2014 | Shim et al. |
| 2014/0192594 A1 | 7/2014 | Lue |
| 2014/0231954 A1 | 8/2014 | Lue |
| 2015/0055413 A1 | 2/2015 | Alsmeier |
| 2015/0076586 A1 | 3/2015 | Rabkin et al. |
| 2015/0115455 A1 | 4/2015 | Chen |
| 2015/0155292 A1 | 6/2015 | Son et al. |
| 2015/0179662 A1 | 6/2015 | Makala et al. |
| 2015/0187425 A1 | 7/2015 | Nam et al. |
| 2015/0236038 A1 | 8/2015 | Pachamuthu et al. |
| 2016/0049421 A1 | 2/2016 | Zhang et al. |
| 2016/0086969 A1 | 3/2016 | Zhang et al. |
| 2016/0329341 A1 | 11/2016 | Shimabukuro et al. |

OTHER PUBLICATIONS

U.S. Appl. No. 15/198,175, filed Jun. 30, 2016, SanDisk Technologies LLC.
U.S. Appl. No. 15/243,260, filed Aug. 22, 2016, SanDisk Technologies LLC.
U.S. Appl. No. 15/296,380, filed Oct. 18, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
Endoh et al., "Novel Ultra High Density Memory with a Stacked-Surrounding Gate Transistor (S-SGT) Structured Cell," IEDM Proc., (2001), 33-36.
International Searching Authority, Invitation to Pay Additional Fees and Partial International Search for PCT/US2015/048513, dated Dec. 1, 2015, 8 pages.

\* cited by examiner

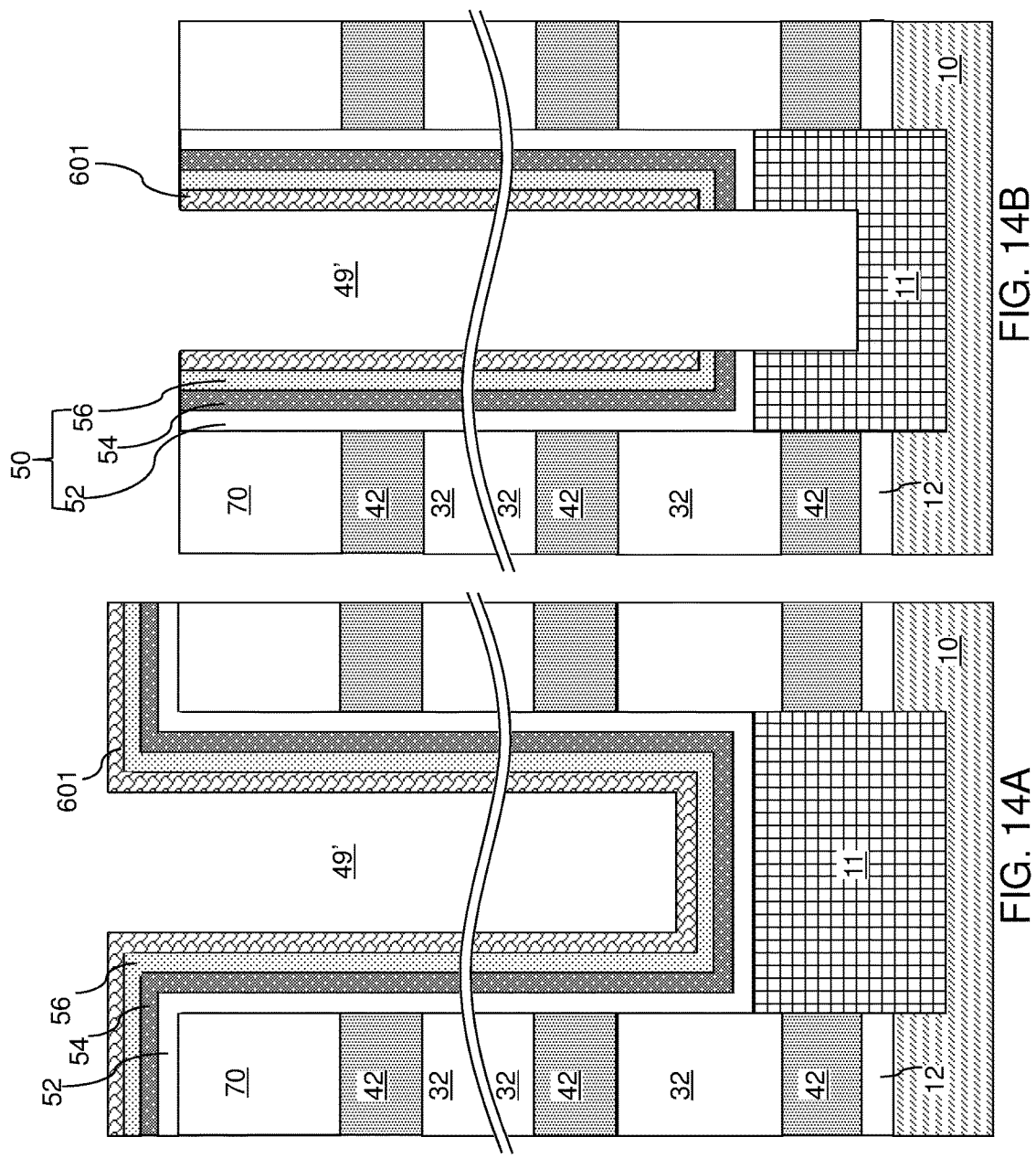

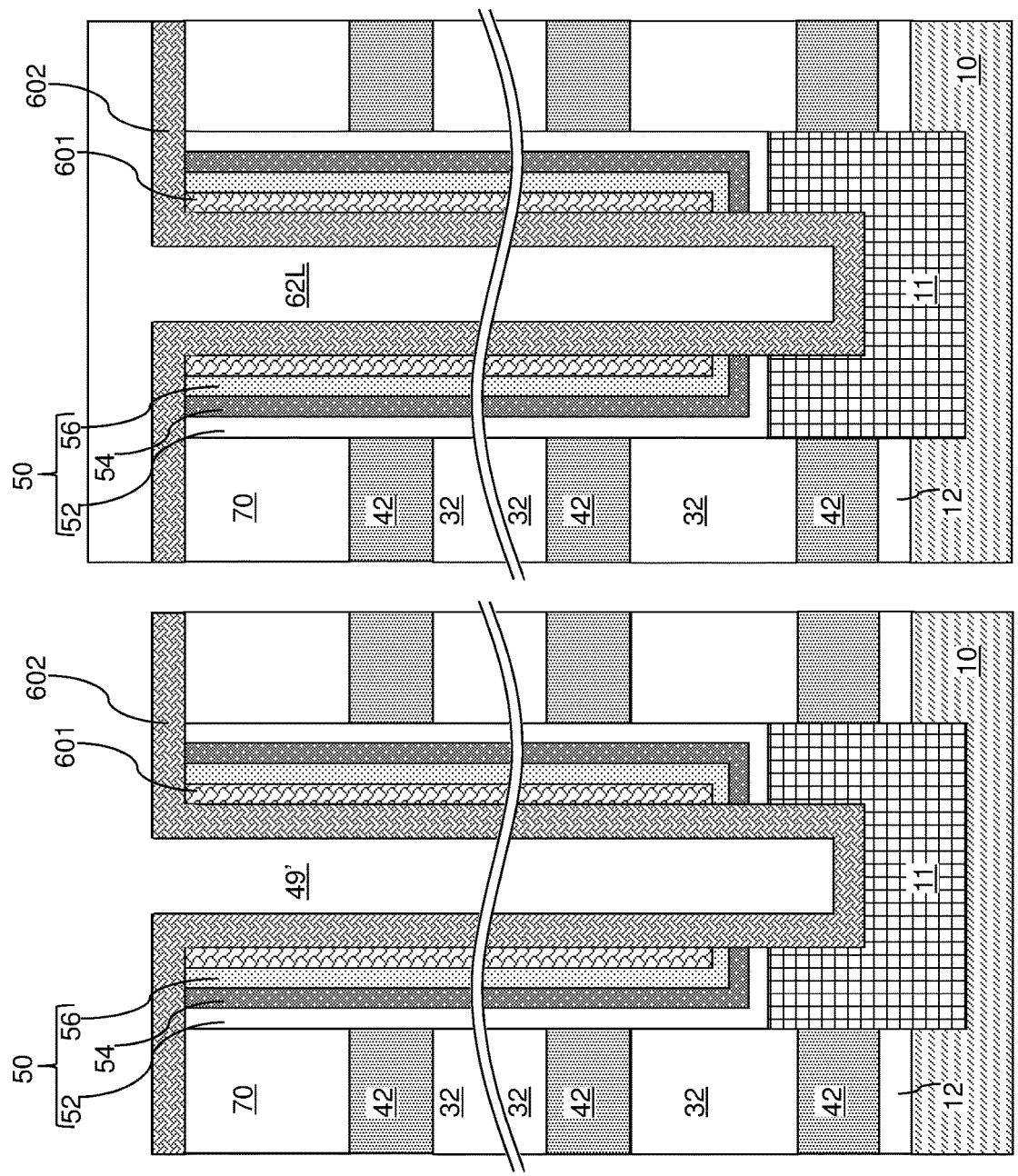

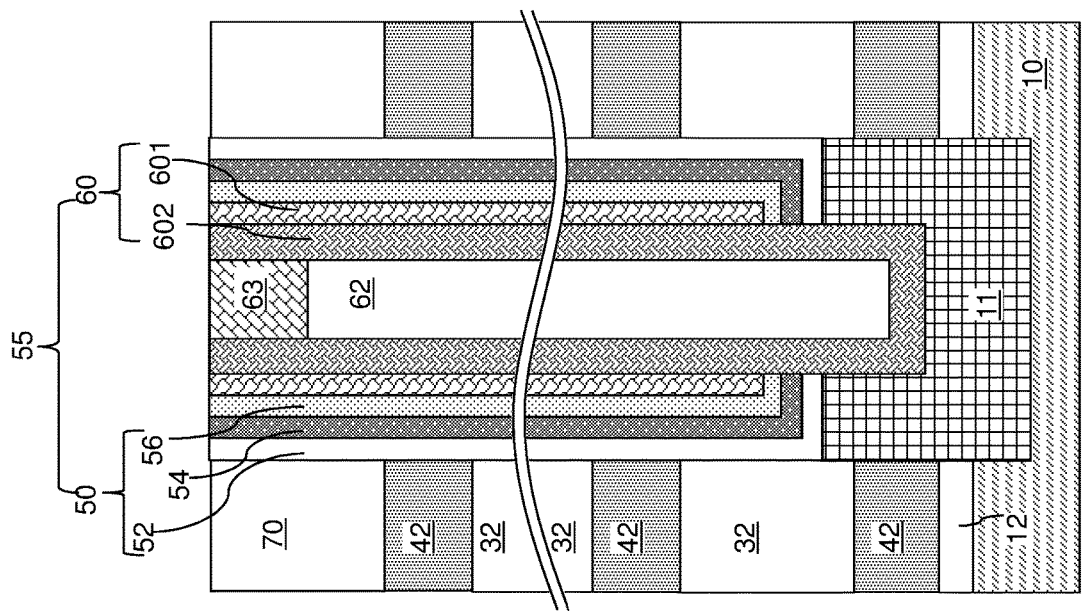
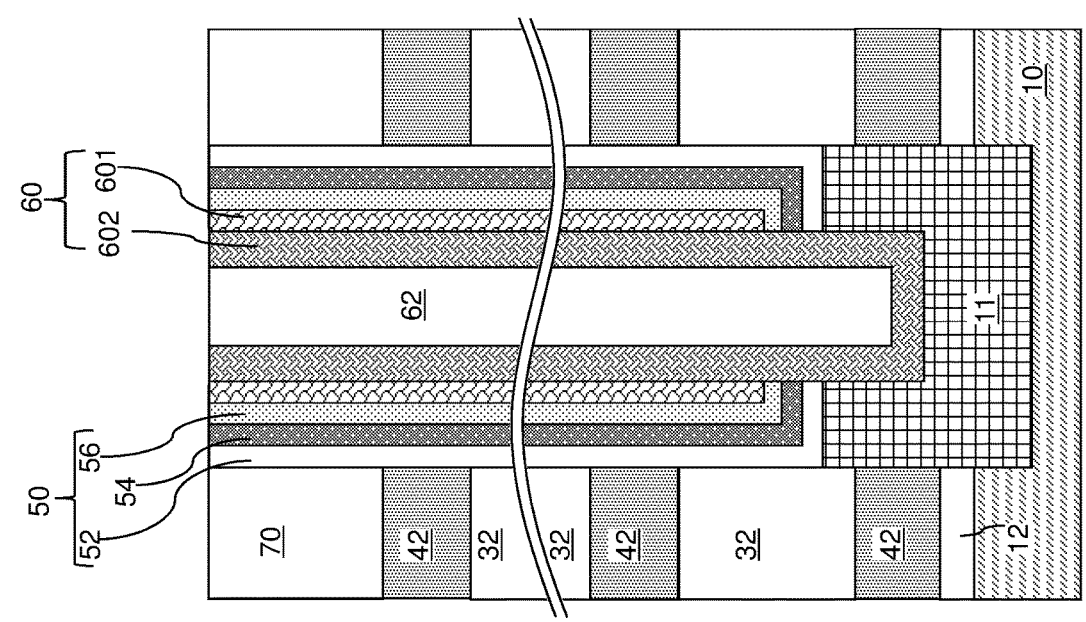

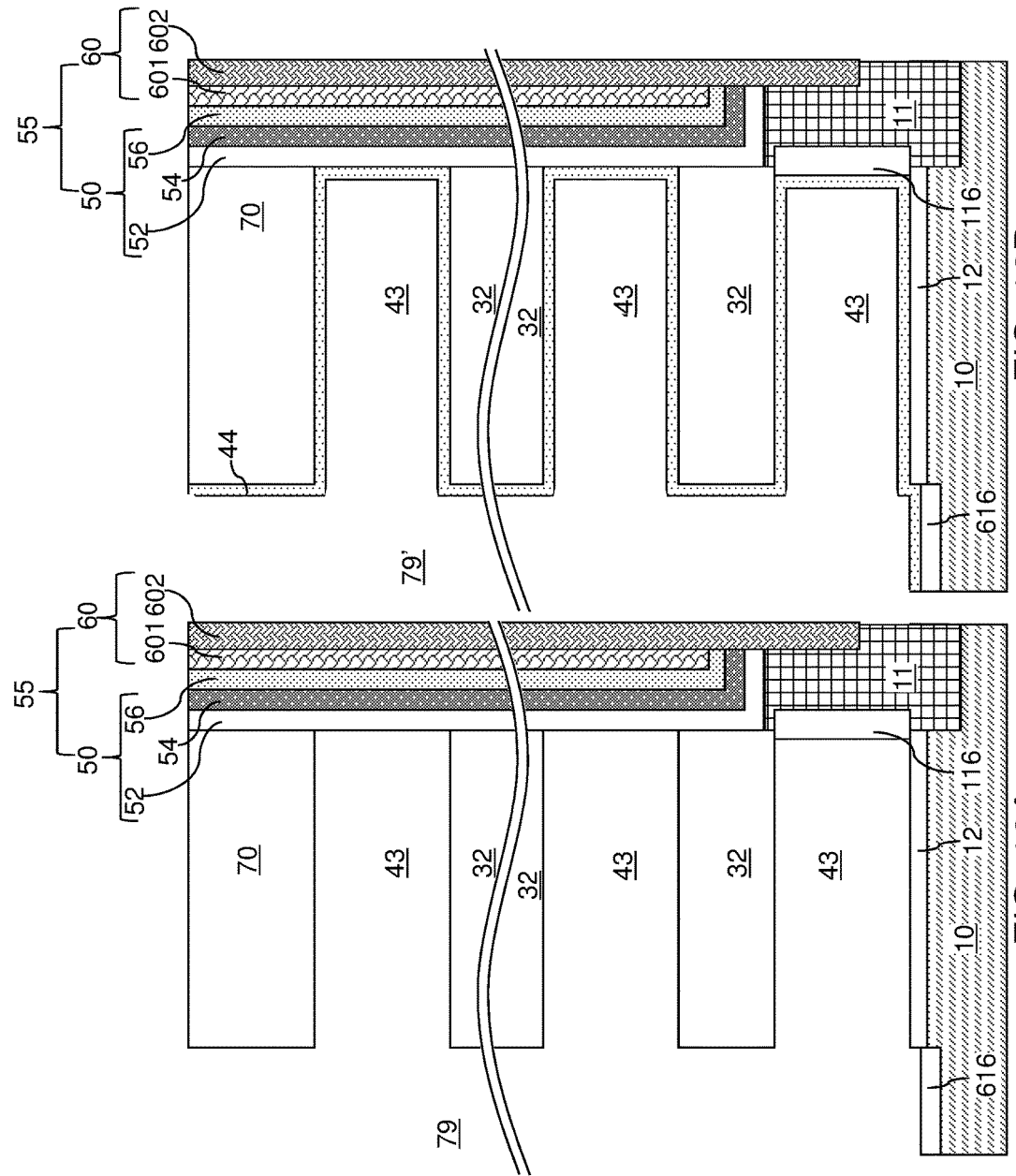

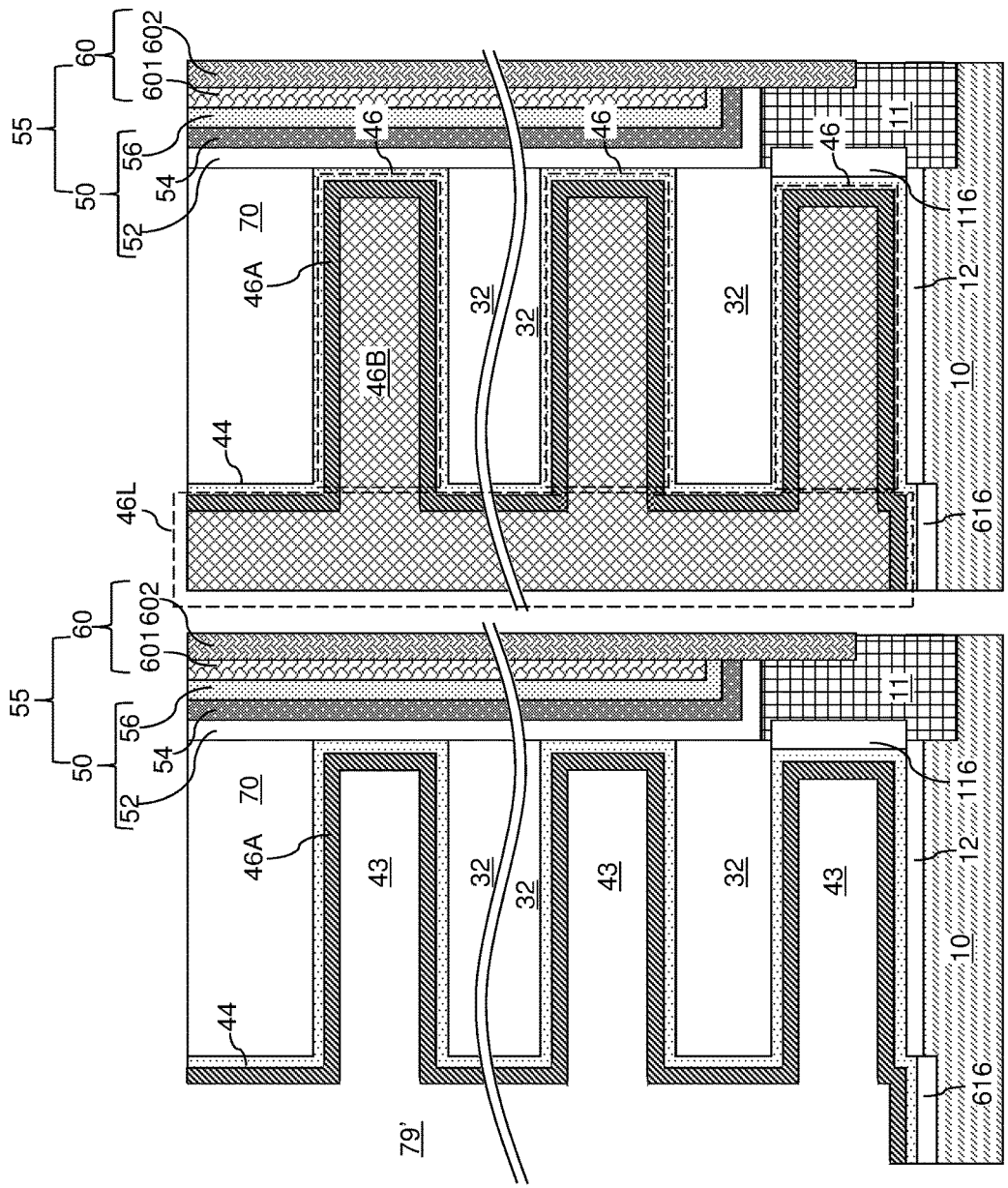

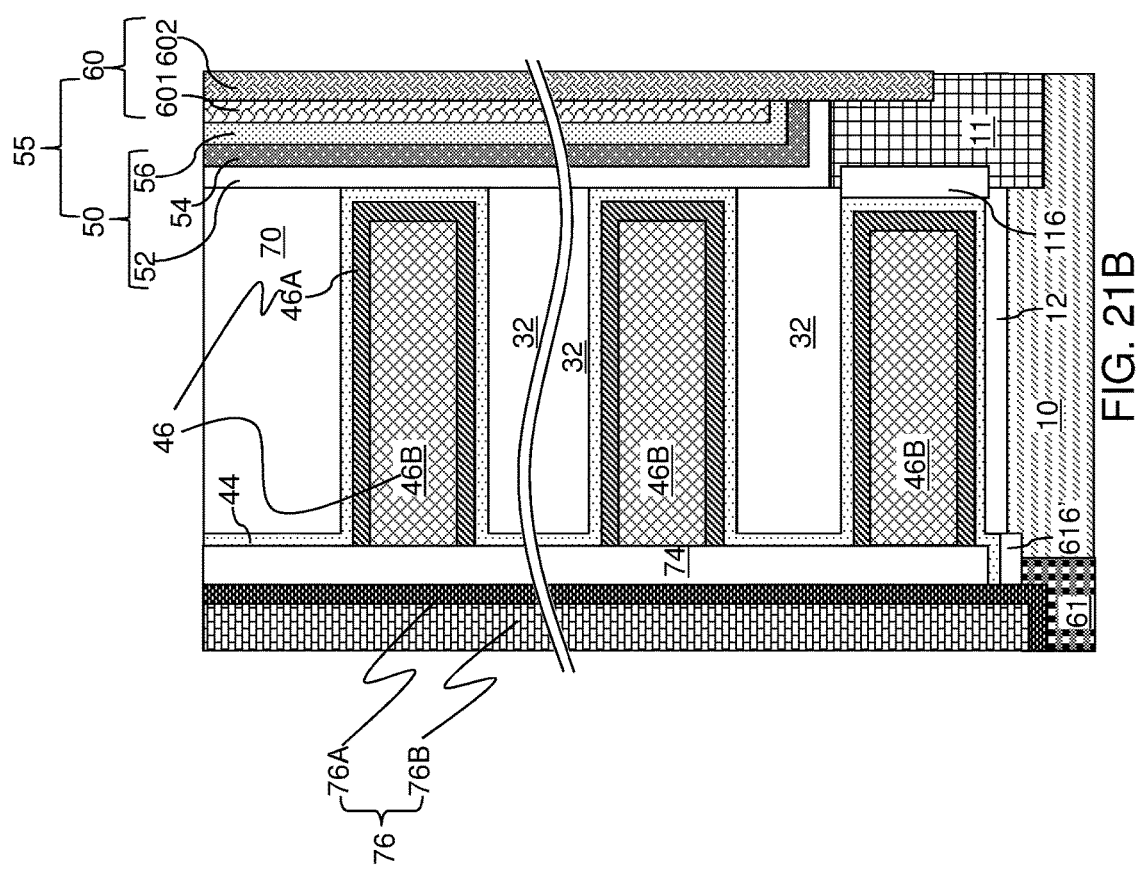

US 9,853,038 B1

THREE-DIMENSIONAL MEMORY DEVICE HAVING INTEGRATED SUPPORT AND CONTACT STRUCTURES AND METHOD OF MAKING THEREOF

FIELD

The present disclosure relates generally to the field of semiconductor devices, and particular to a three-dimensional memory device employing integrated support and contact structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film and a vertical semiconductor channel contacting an inner sidewall of the memory film; and at least one integrated support and contact structure. wherein each of the at least one integrated support and contact structure includes: a contact via structure contacting a top surface of a respective one of the electrically conductive layers; a tubular dielectric liner that laterally surrounds the contact via structure; and a fin-containing dielectric pillar underlying the respective contact via structure and including a respective dielectric fin that laterally protrudes outward at each level of one or more underlying insulating layers that underlies a horizontal plane including a bottom surface of the contact via structure.

According to another aspect of the present disclosure, a method of forming a three-dimensional memory device is provided. An alternating stack of insulating layers and sacrificial material layers is formed over a substrate. Memory openings and support openings are formed through the alternating stack. The support openings are laterally expanded by laterally recessing the insulating layers with respect to the sacrificial material layers. The laterally expanded support openings are filled with a combination of a dielectric material and a sacrificial fill material to form support pillar structures. Memory stack structures are formed in the memory openings. The sacrificial material layers are replaced with electrically conductive layers while the support pillar structures provide structural support to the insulating layers.

BRIEF DESCRIPTION OF THE DRAWINGS

FIGS. 14A-14F are sequential schematic vertical cross-sectional views of a memory opening during formation of a memory stack structure, a dielectric core, and a drain region according to an embodiment of the present disclosure.

FIGS. 18A-18D are sequential vertical cross-sectional views of a region of the exemplary structure during formation of electrically conductive layers according to an embodiment of the present disclosure.

FIG. 21B is a magnified view of a region of the exemplary structure of FIG. 21A.

DETAILED DESCRIPTION

Figure 1:
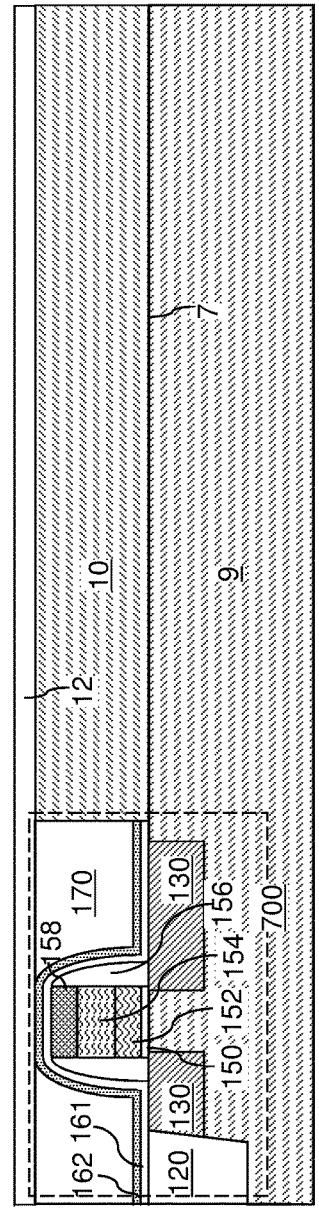
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material"

refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
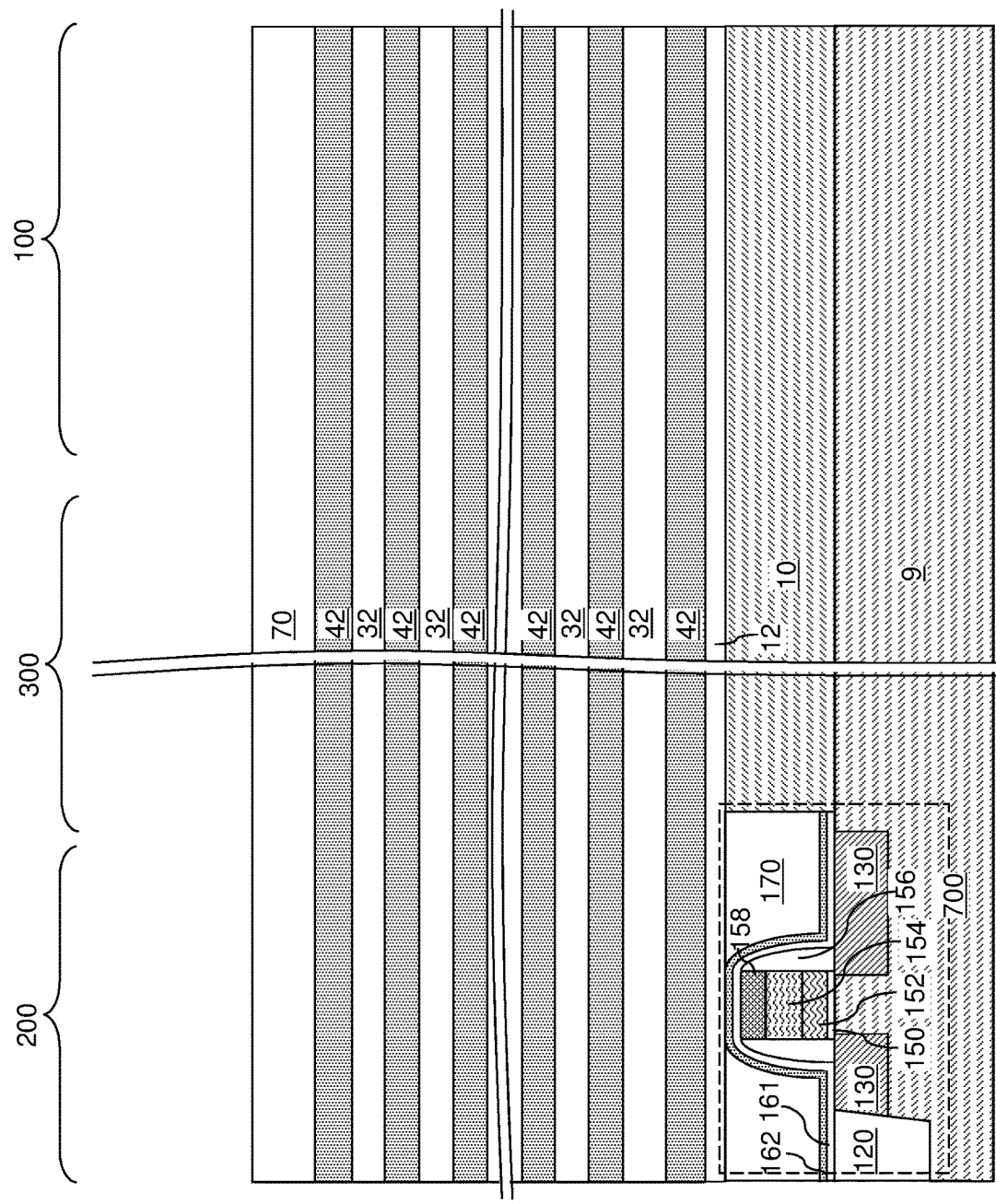
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
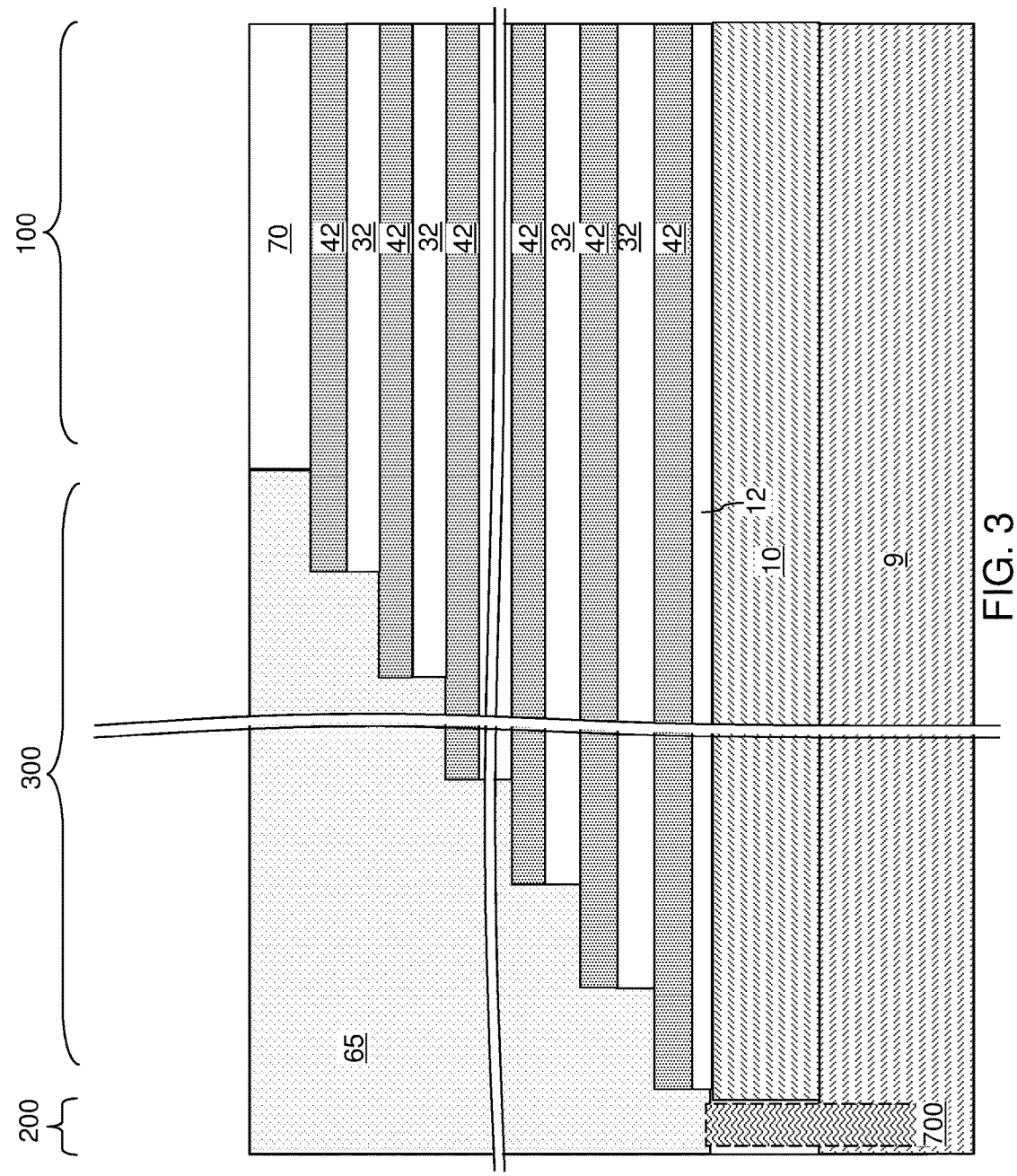
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including the alternating stack (32, 42) is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). Each sacrificial material layer 42 other than the topmost sacrificial material layer 42 within the alternating stack (32, 42) laterally extends farther than any overlying sacrificial material layer 42 within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
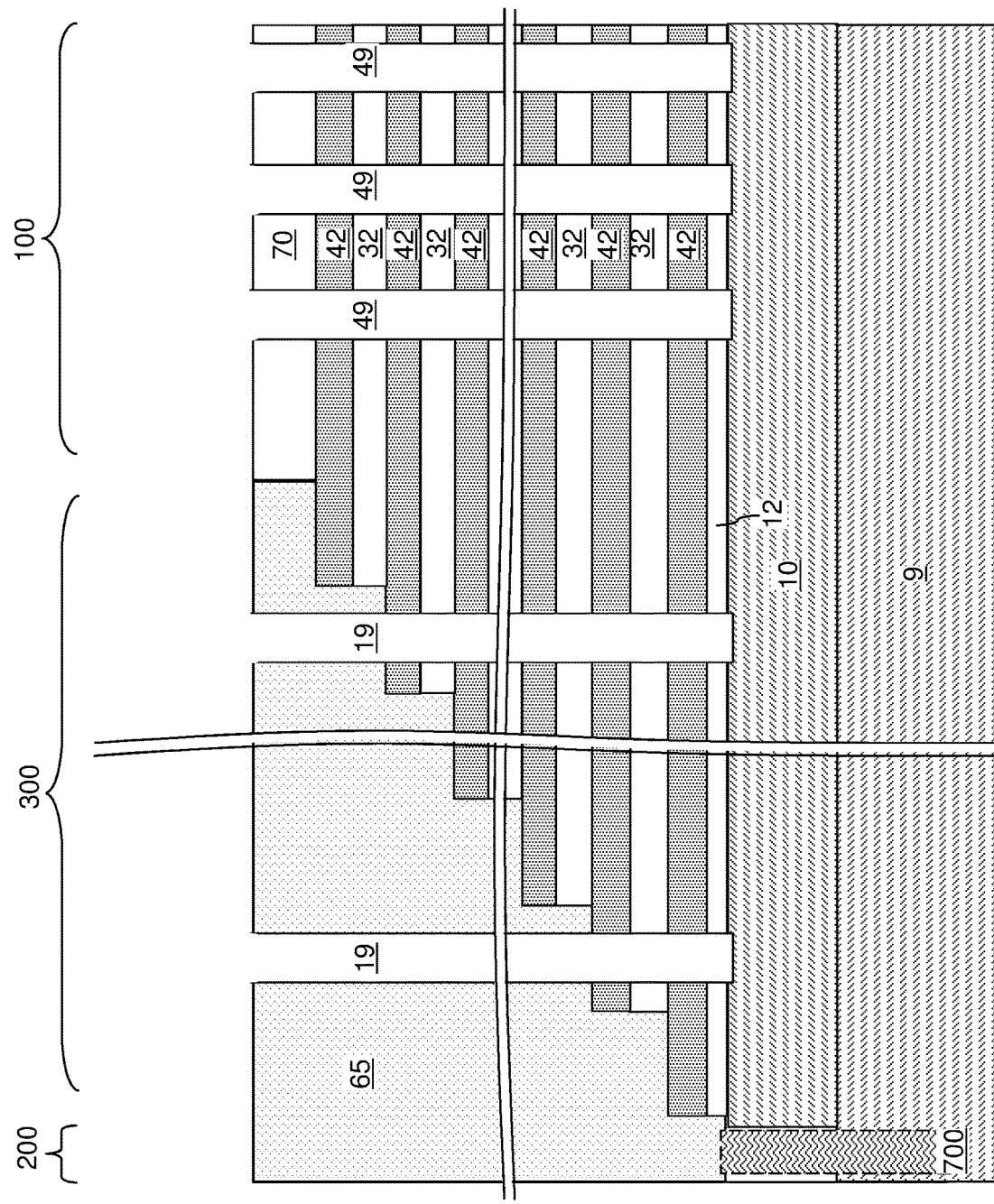
FIG. 4A is a schematic vertical cross-sectional view of the exemplary structure after formation of memory openings and support openings according to an embodiment of the present disclosure.
Figure 4B:
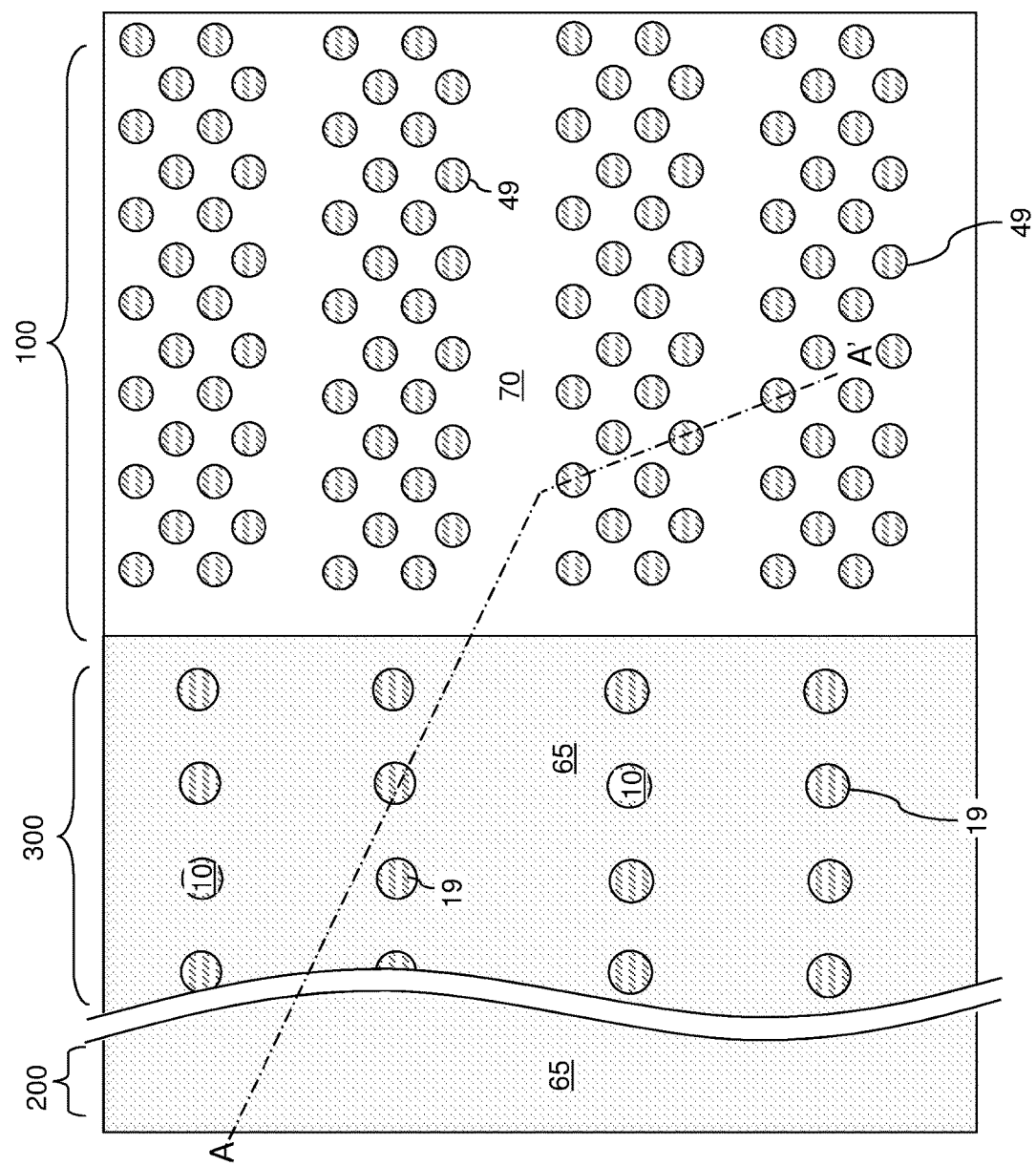
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300. The memory openings 49 and the support openings 19 are simultaneously formed employing the same anisotropic etch process.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5:
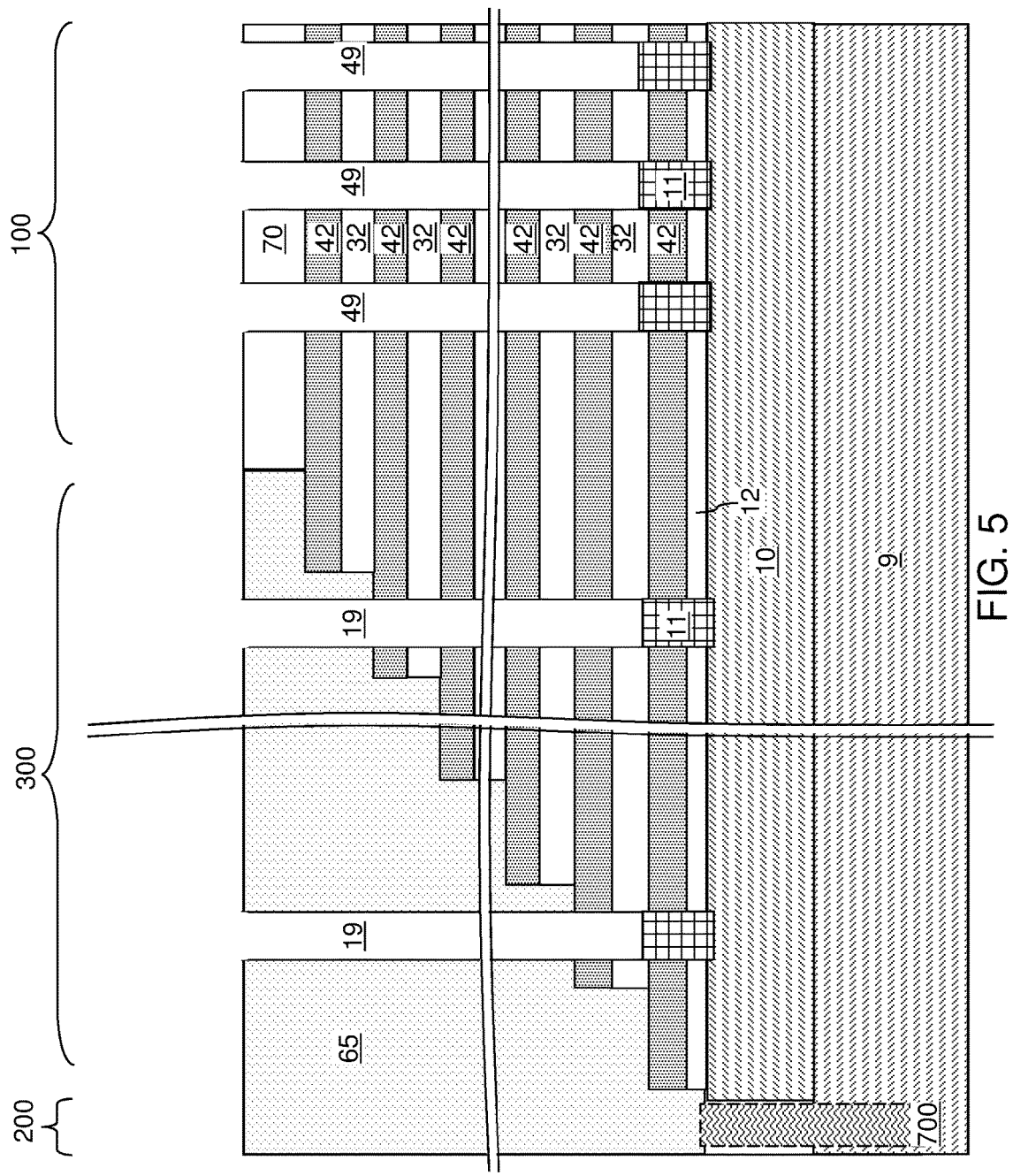
FIG. 5 is a schematic vertical cross-sectional view of the exemplary structure after formation of semiconductor pedestal structures according to an embodiment of the present disclosure.

Referring to FIG. 5, an optional semiconductor pedestal (e.g., an epitaxial pedestal) 11 can be formed at the bottom portion of each memory opening 49 and each support openings 19, for example, by selective epitaxy. Each semiconductor pedestal 11 comprises a single crystalline semiconductor material in epitaxial alignment with the single crystalline semiconductor material of the semiconductor material layer 10. In one embodiment, the semiconductor pedestal 11 can be doped with electrical dopants of the same conductivity type as the semiconductor material layer 10. In one embodiment, the top surface of each semiconductor pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the semiconductor pedestals 11 with a respective conductive material layer. The semiconductor pedestal 11 can be a portion of a transistor channel that extends between a source region to be subsequently formed in the substrate (9, 10) and a drain region to be subsequently formed in an upper portion of the memory opening 49. A cavity is present in the unfilled portion of the memory opening 49 above the semiconductor pedestal 11. In one embodiment, the semiconductor pedestal 11 can comprise single crystalline silicon. In one embodiment, the semiconductor pedestal 11 can have a doping of the first conductivity type, which is the same as the conductivity type of the semiconductor material layer 10 that the semiconductor pedestal contacts. If a semiconductor material layer 10 is not present, the semiconductor pedestal 11 can be formed directly on the substrate semiconductor layer 9, which can have a doping of the first conductivity type.

Figure 6:
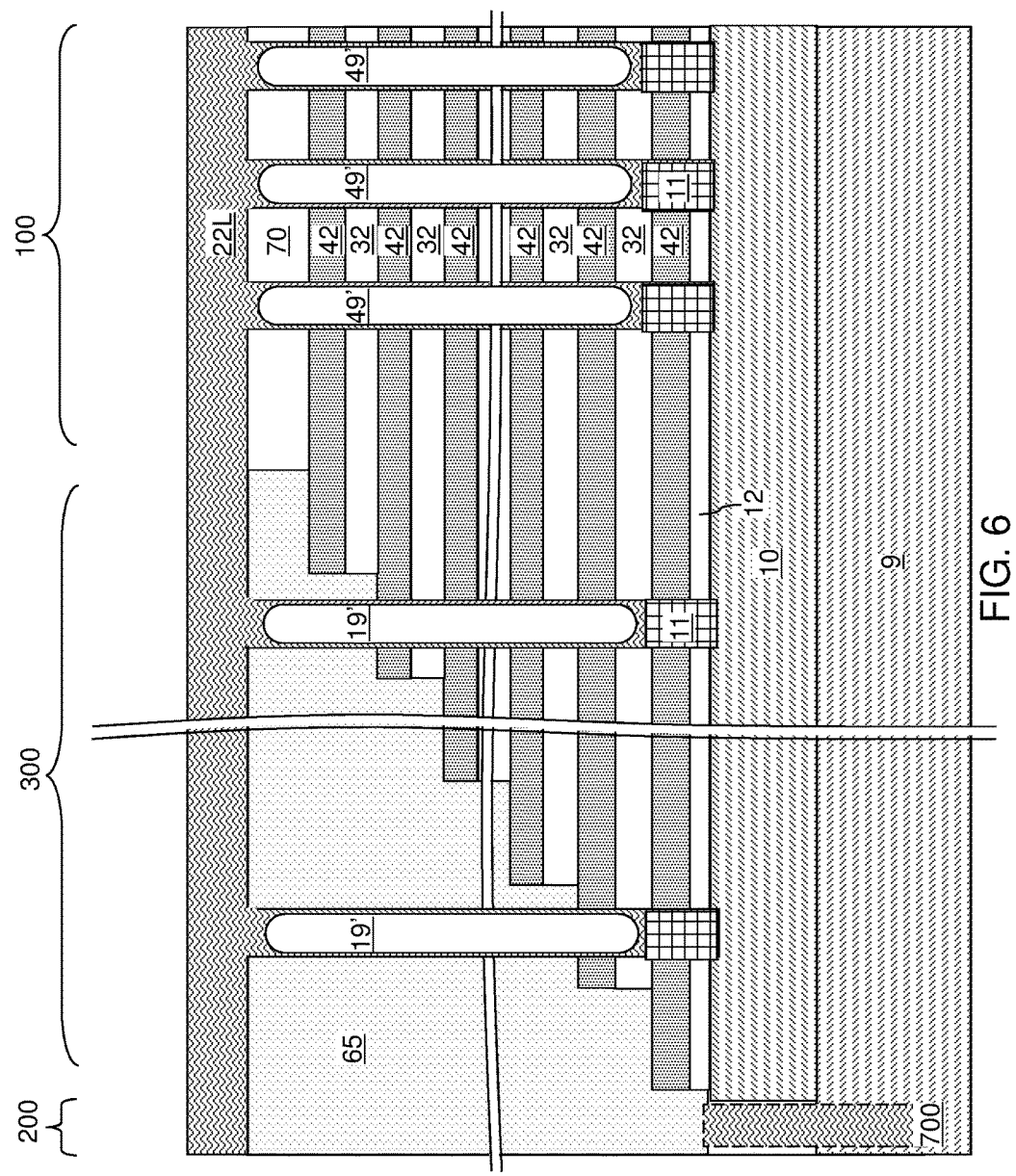
FIG. 6 is a schematic vertical cross-sectional view of the exemplary structure after formation of a sacrificial cover material layer according to an embodiment of the present disclosure.

Referring to FIG. 6, a sacrificial cover material layer 22L can be deposited over the memory openings 49 and the support openings 19. Optionally, a portion of the sacrificial cover material layer 22L can also be deposited into the memory openings 49 and the support openings 19. The sacrificial cover material layer 22L includes a material that can be removed selective to the materials of the insulating cap layer 70, the retro-stepped dielectric material portion 65, and the sacrificial material layers 42. Non-limiting examples of materials that can be employed for the sacrificial cover material layer 22L include amorphous silicon, amorphous carbon, diamond-like carbon (DLC), germanium, a silicon-germanium alloy, organosilicate glass, and a silicon-based polymer material. The sacrificial cover material layer 22L can be deposited by a non-conformal deposition process to form a memory cavity 49' within each memory opening 49 and to form a support cavity 19' within each support opening 19. For example, the sacrificial cover material layer 22L can be deposited by plasma enhanced chemical vapor deposition (PECVD). Each of the memory cavities 49' and the support cavities 19' can be an encapsulated cavity, of which the volume is bounded by a closed surface that seals the volume therein. Each of the memory cavities 49' and the support cavities 19' can vertically extend through each sacrificial material layer 42 except the sacrificial material layer(s) 42 contacting the semiconductor pedestals 11.

Figure 7A:
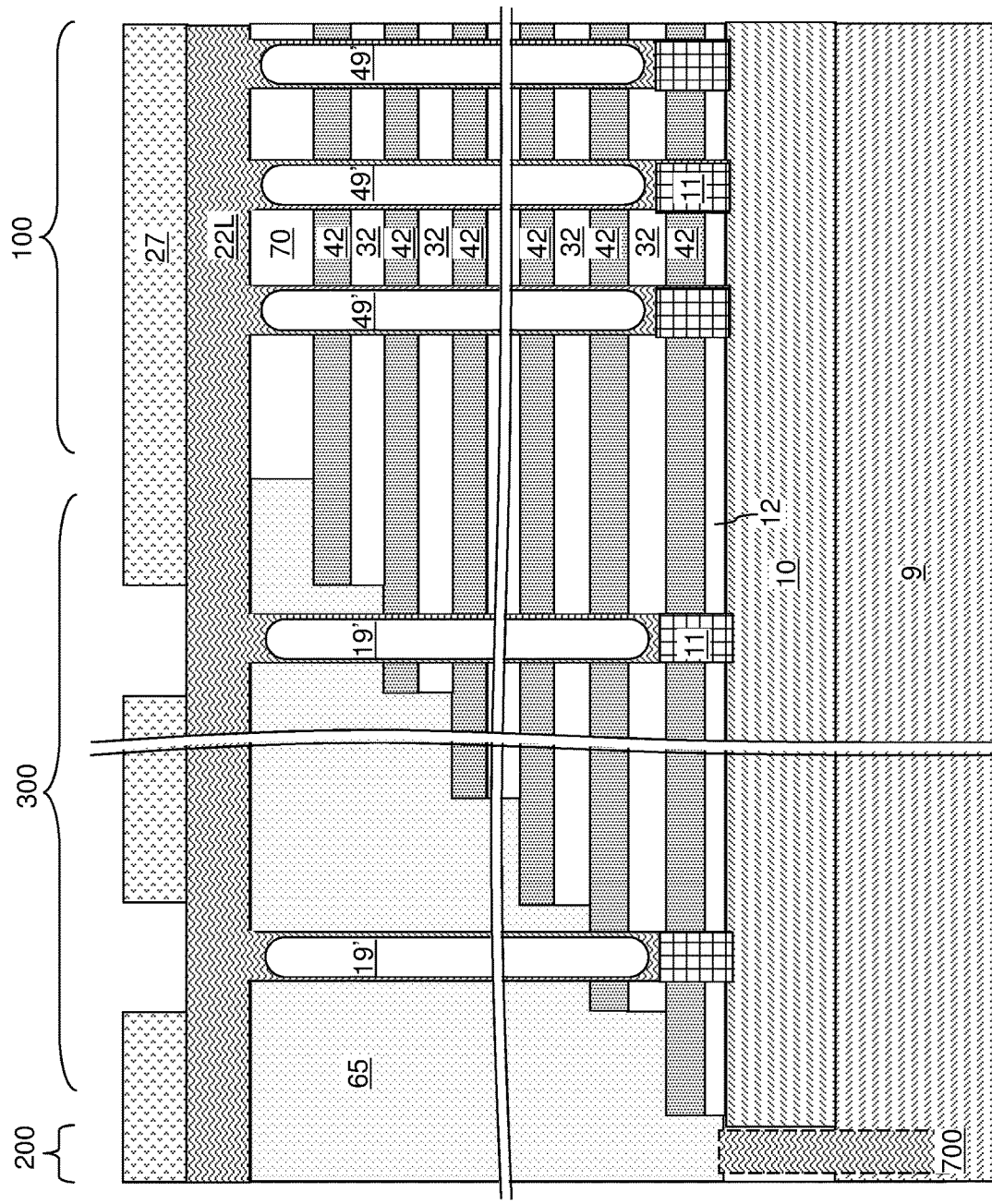
FIG. 7A is a schematic vertical cross-sectional view of the exemplary structure after application and patterning of a photoresist layer over the sacrificial cover layer according to an embodiment of the present disclosure.
Figure 7B:
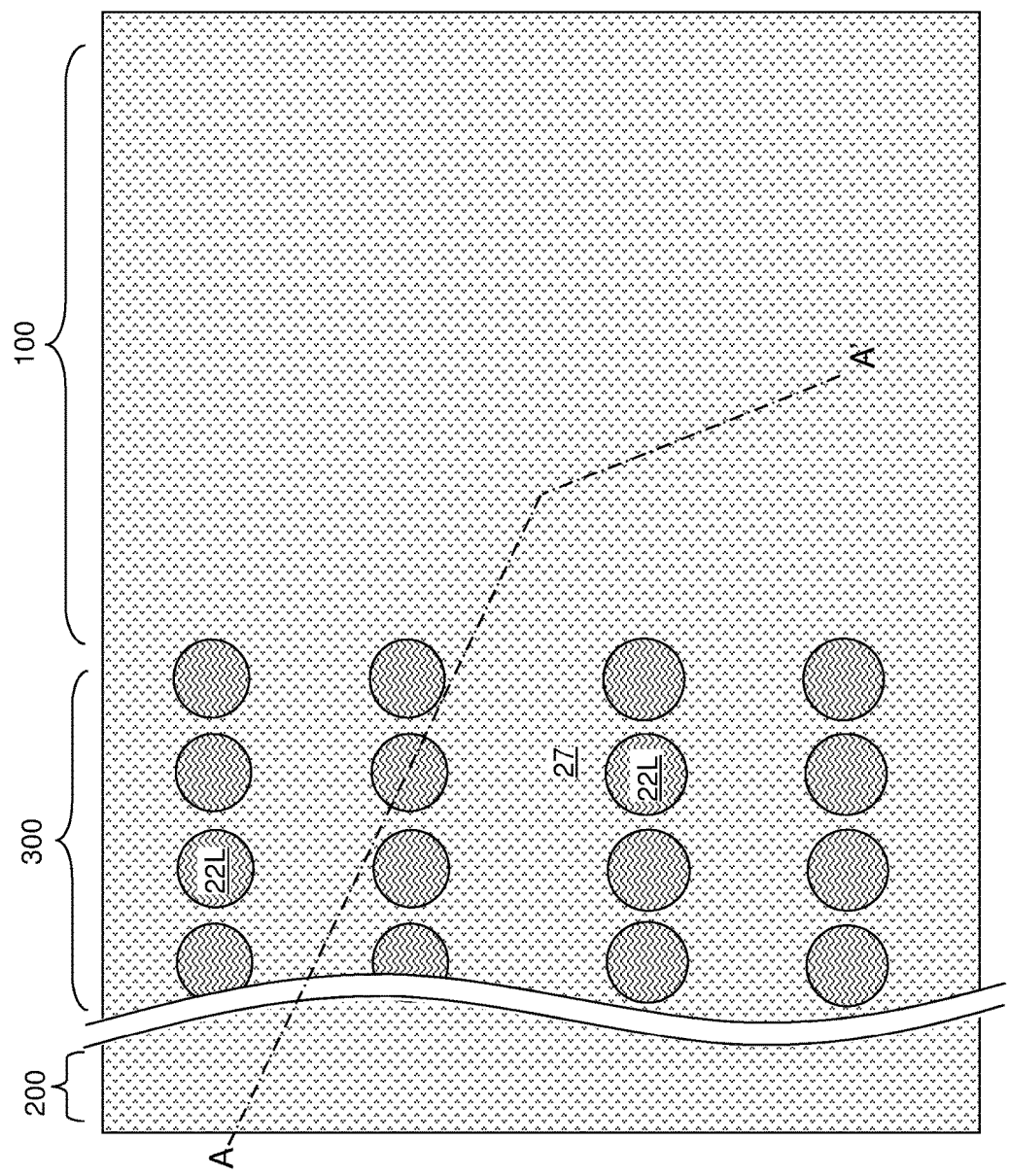
FIG. 7B is a top-down view of the exemplary structure of FIG. 7A. The vertical plane A-A' is the plane of the cross-section for FIG. 7A.

Referring to FIGS. 7A and 7B, a photoresist layer 27 can be applied over the sacrificial cover material layer 22L, and can be lithographically patterned to form openings over the support openings 19 but not over the memory openings 49. Each opening in the patterned photoresist layer 27 can overlie an underlying support opening 19. In one embodiment, a geometrical center of each opening in the patterned photoresist layer 27 can coincide with, or can be located in proximity to, the vertical axis passing through the geometrical center of the underlying support opening 19. As used herein, a "geometrical center" of an element refers to the center of mass of a hypothetical object occupying an identical volume as the object and having a uniform density throughout. In one embodiment, the periphery of each opening in the patterned photoresist layer 27 can be laterally offset outward from the periphery of the underlying support opening 19 by a uniform lateral distance, which can be in a range from 10 nm to 100 nm, such as from 2 nm to 50 nm, although lesser and greater uniform lateral distances can also be employed. For example, in case the openings in the patterned photoresist layer 27 have a circular horizontal cross-sectional shape, the diameter of each opening in the patterned photoresist layer 27 can be in a range from 200 nm to 400 nm.

Figure 8:
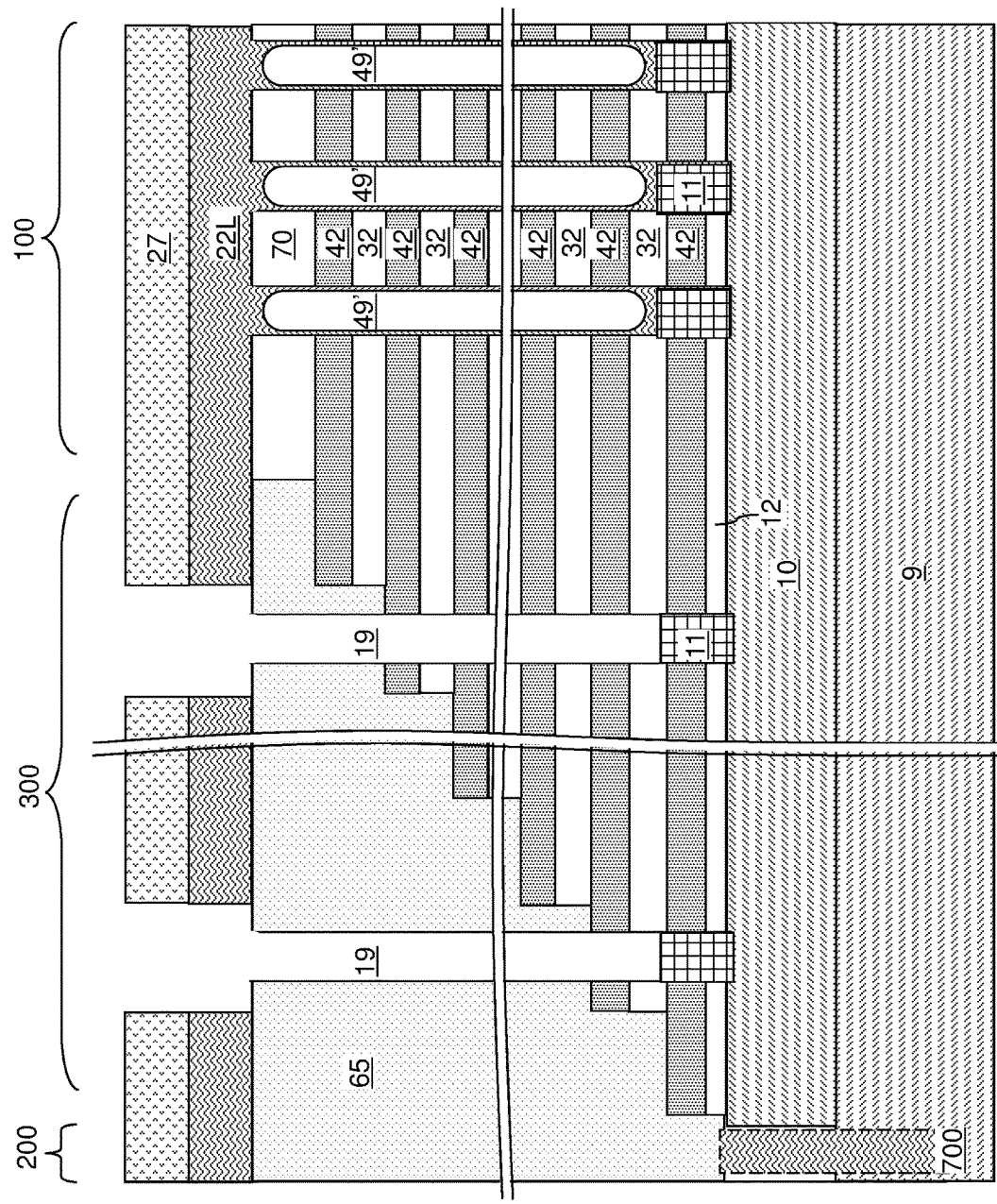
FIG. 8 is a schematic vertical cross-sectional view of the exemplary structure after removal of portions the sacrificial cover layer from over the support openings according to an embodiment of the present disclosure.

Referring to FIG. 8, an etch process can be performed to remove portions of the sacrificial cover material layer 22L that are not covered by the patterned photoresist layer 27. The etch process can include an anisotropic etch step that removes unmasked portions of the sacrificial cover material layer 22L from above the top surface of the retro-stepped dielectric material layer 65. The anisotropic etch step can be selective to the materials of the retro-stepped dielectric material layer 65 and the alternating stack (32, 42). If any of the portions of the sacrificial cover material layer 22L are located within the support openings 19, then they also can be removed by extending the anisotropic etch step, or can be removed by performing an isotropic etch process that is selective to the materials of the retro-stepped dielectric material layer 65 and the alternating stack (32, 42). Thus, the material of the sacrificial cover material layer 22L can be removed from within each of the support openings 19. A top surface of an epitaxial pedestal portion 11 (or a top surface of the semiconductor material layer 10 in case the epitaxial pedestal portions 11 are not formed) can be physically exposed at the bottom of each support opening 19.

Figure 9:
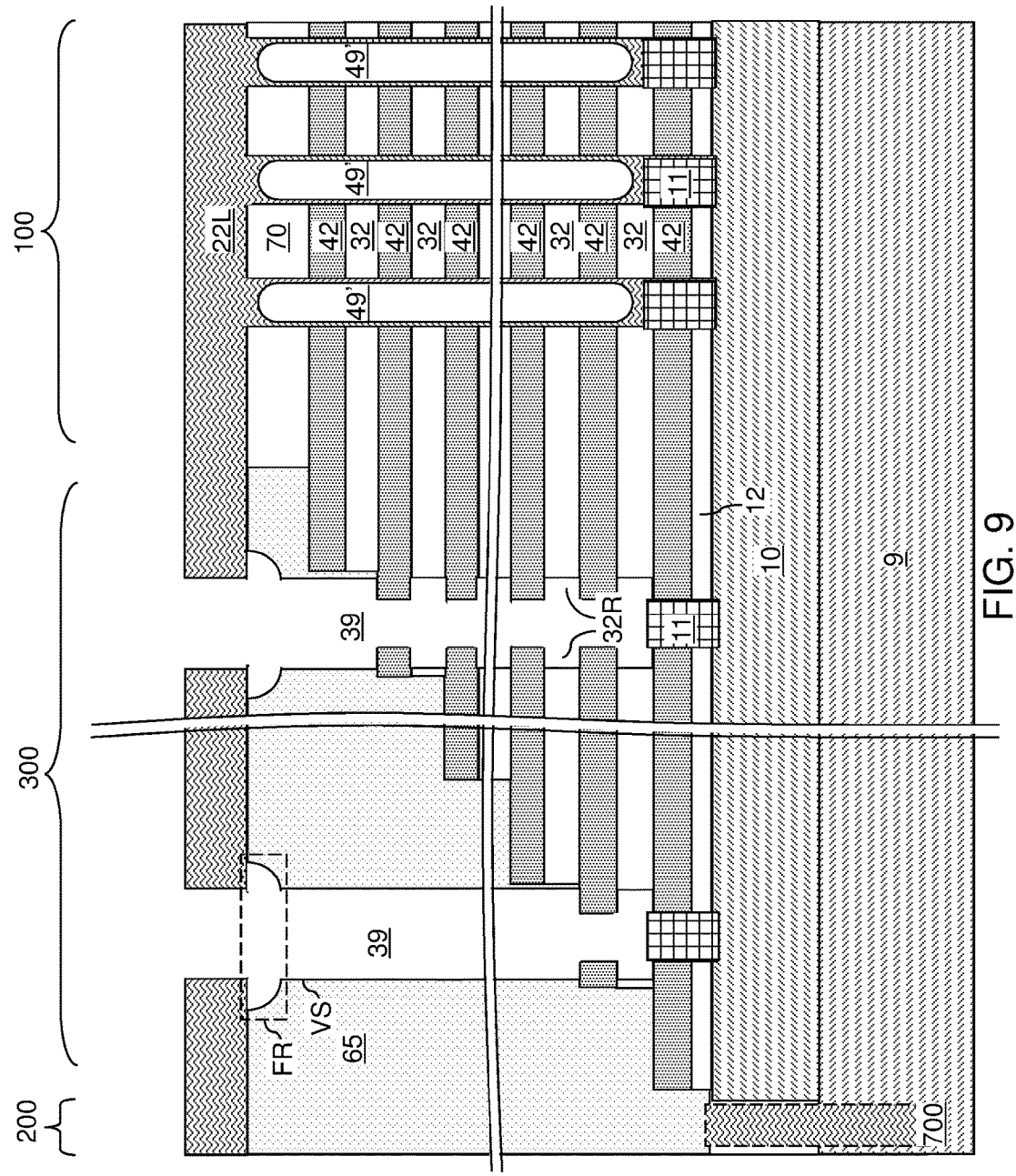
FIG. 9 is a schematic vertical cross-sectional view of the exemplary structure after laterally expanding the support openings by laterally etching the insulating layers according to an embodiment of the present disclosure.

Referring to FIG. 9, the support openings 19 can be laterally expanded by selectively laterally etching the insulating layers 32 with respect to the sacrificial material layers 42. In one embodiment, the support openings 19 can be laterally expanded while each of the memory openings 49 is covered with a cavity-containing masking material, i.e., the sacrificial cover material layer 22L. The lateral etching of the insulating layers 32 can be performed by an isotropic etch process such as a wet etch process to form lateral recesses 32R in the insulating layers 32 between adjacent sacrificial material layers 42. For example, if the insulating layers 32 include silicon oxide and the sacrificial material layers 42 include silicon nitride, a wet etch employing hydrofluoric acid can be performed to laterally etch the material of the insulating layers 32 selective to the material of the sacrificial material layers 42.

In one embodiment, surface portions of the retro-stepped dielectric material portion 65 can be etched during the lateral recessing of the insulating layers 32 to laterally expand each portion of the support openings 19 that is laterally surrounded by the retro-stepped dielectric material portion 65. In one embodiment, a flaring region FR can be formed around an upper end of each of the support openings 19 while laterally recessing the insulating layers 32 with respect to the sacrificial material layers 42 to form a "wine glass" shaped laterally expanded support opening 39. The flaring region FR of each support opening 19 includes concave sidewalls of the retro-stepped dielectric material portion 65 that laterally extends farther than an underlying vertical sidewall VS of the laterally expanded support opening 39. The patterned photoresist layer 27 can be removed selective to the sacrificial cover material layer 22L prior to, or after, lateral expansion of the support openings 19 into the laterally expanded support openings 39.

Figure 10:
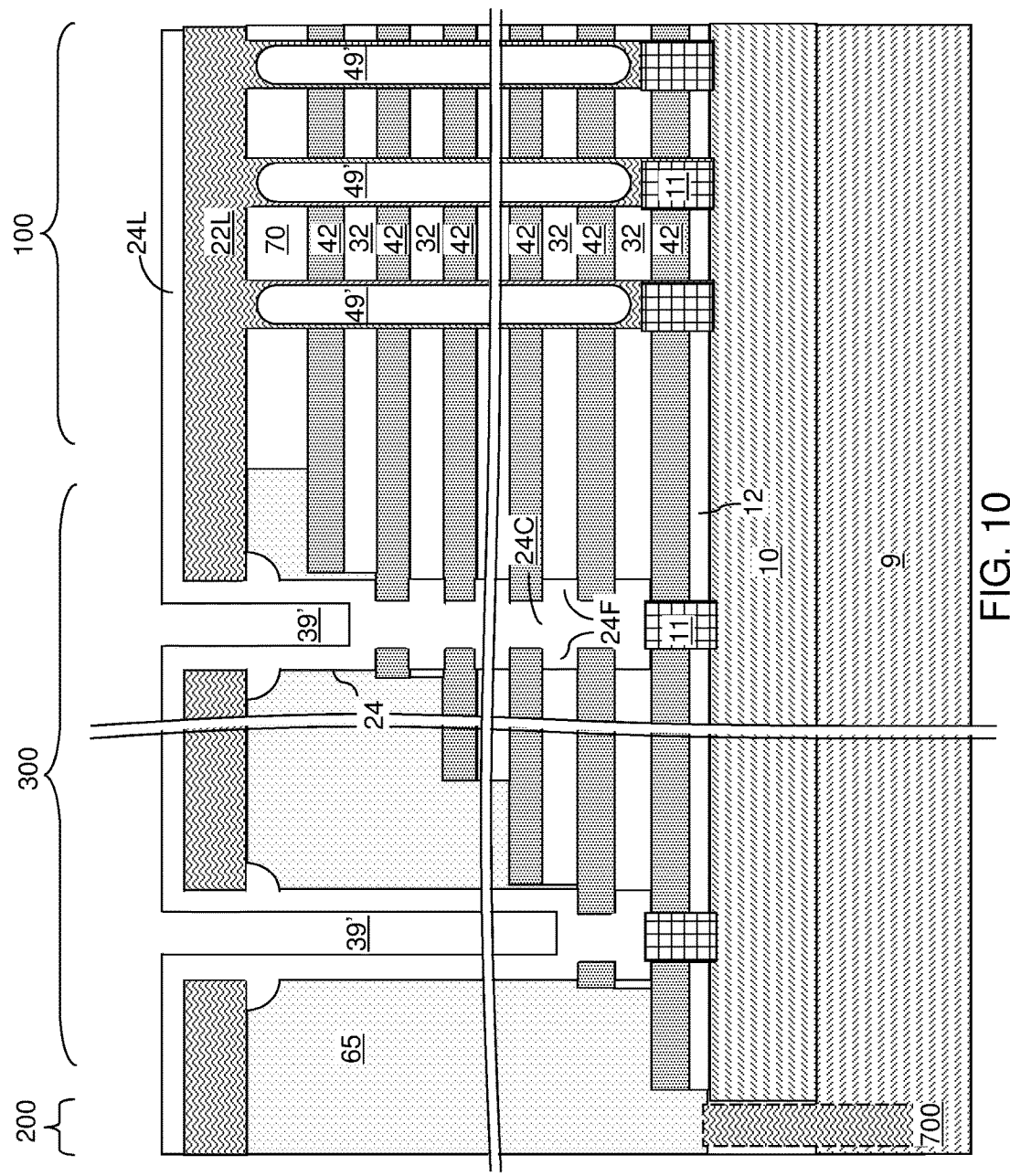
FIG. 10 is a schematic vertical cross-sectional view of the exemplary structure after depositing a dielectric fill material layer according to an embodiment of the present disclosure.

Referring to FIG. 10, a dielectric fill material layer 24L can be conformally deposited to fill regions of each laterally expanded support opening 39 located underneath the retro-stepped dielectric material portion 65 and peripheral portions of the regions of each laterally expanded support opening 39 laterally surrounded by the retro-stepped dielectric material portion 65. The dielectric fill material layer 24L can include a dielectric material such as silicon oxide and/or a dielectric metal oxide. The dielectric fill material layer 24L can be deposited, for example, by low pressure chemical vapor deposition (LPCVD) or by atomic layer deposition. The thickness of the dielectric fill material layer 24L can be selected to be the same as or greater than the radius of the support openings 19, greater than one half of the thickness of the insulating layers 32 and greater than one half of the lateral separation distance between opposing sidewalls of the sacrificial material layers 42 around each laterally expanded support opening 39. Further, the thickness of the dielectric fill material layer 24L can be less than the lateral separation distance between opposing vertical sidewalls of the retro-stepped dielectric material portion 65 around each laterally expanded support opening 39. Thus, the deposited dielectric material of the dielectric fill material layer 24L includes a fin-containing and cavity-containing dielectric pillar 24 within each of the support openings 39. Each laterally protruding portion of a fin-containing and cavity-containing dielectric pillar 24 at levels of the insulating layers 32 constitutes a fin 24F of the fin-containing and cavity-containing dielectric pillar 24. The fins 24F protrude into and fill the lateral recesses 32R. As used herein, a "fin" refers to a protruding structure. Each fin 24F of a fin-containing and cavity-containing dielectric pillar 24 can have an annular configuration, i.e., can have a shape of a ring that surrounds a central cylindrical portion 24C of the pillar 24. A support cavity 39' can be formed within each laterally expanded support opening 39 inside the retro-stepped dielectric material portion 65. The support cavities 39' can be located above the stepped surfaces underlying the retro-stepped dielectric material portion 65.

Figure 11:
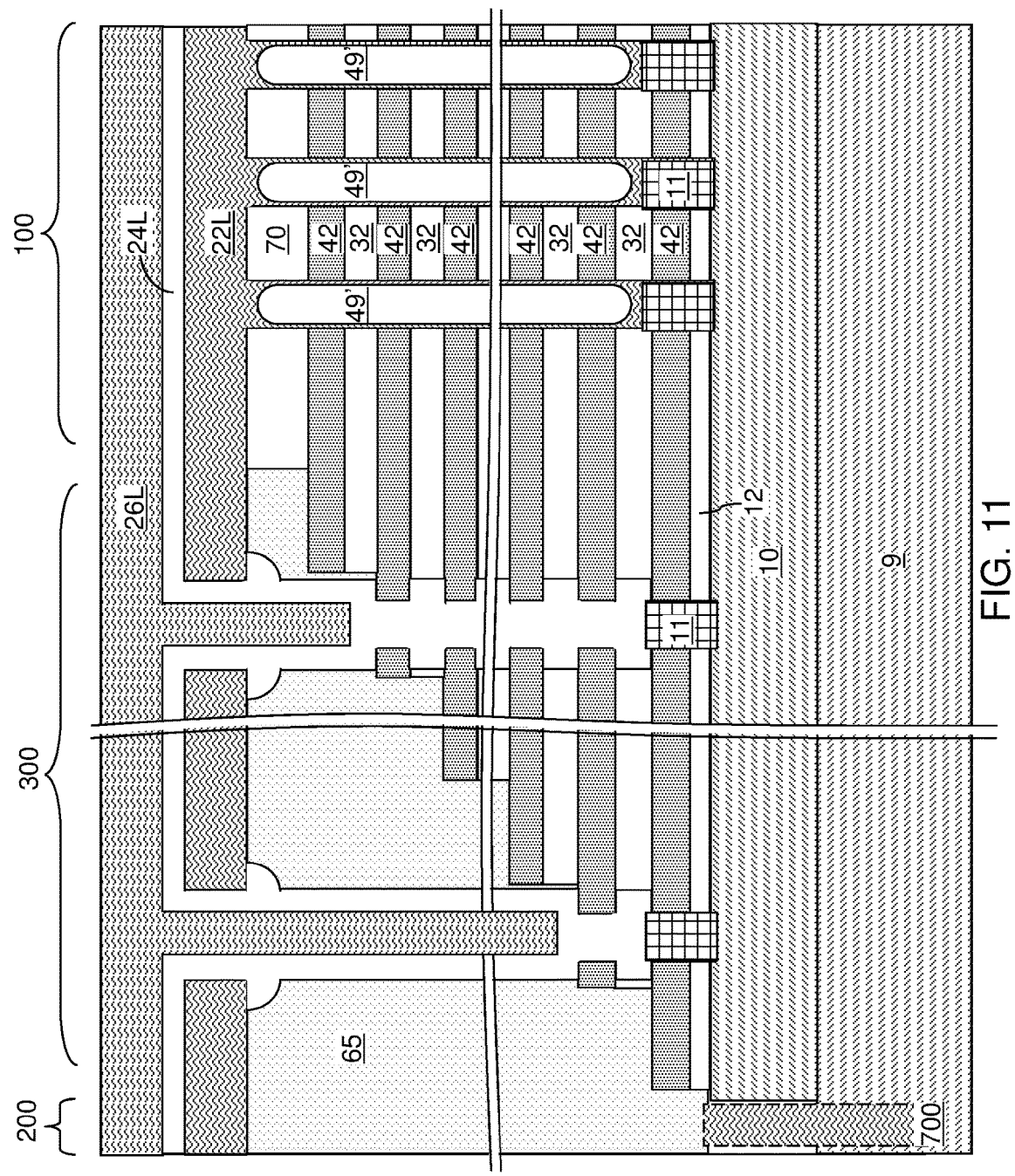
FIG. 11 is a schematic vertical cross-sectional view of the exemplary structure after depositing a sacrificial fill material layer according to an embodiment of the present disclosure.

Referring to FIG. 11, a sacrificial fill material layer 26L including a sacrificial fill material can be deposited within each of the support cavities 39' and above horizontal portions of the dielectric fill material layer 24L. The sacrificial fill material of the sacrificial fill material layer 26L includes a material that is different from the material of the dielectric fill material layer 24L. For example, the sacrificial fill material of the sacrificial fill material layer 26L can be selected from amorphous silicon, amorphous carbon, diamond-like carbon (DLC), germanium, a silicon-germanium alloy, organosilicate glass, and a silicon-based polymer material. The sacrificial fill material layer 26L can be deposited by a conformal deposition process such as chemical vapor deposition or atomic layer deposition. Thus, each laterally expanded support opening 39 can be filled with a combination of a dielectric material and a sacrificial fill material.

Figure 12A:
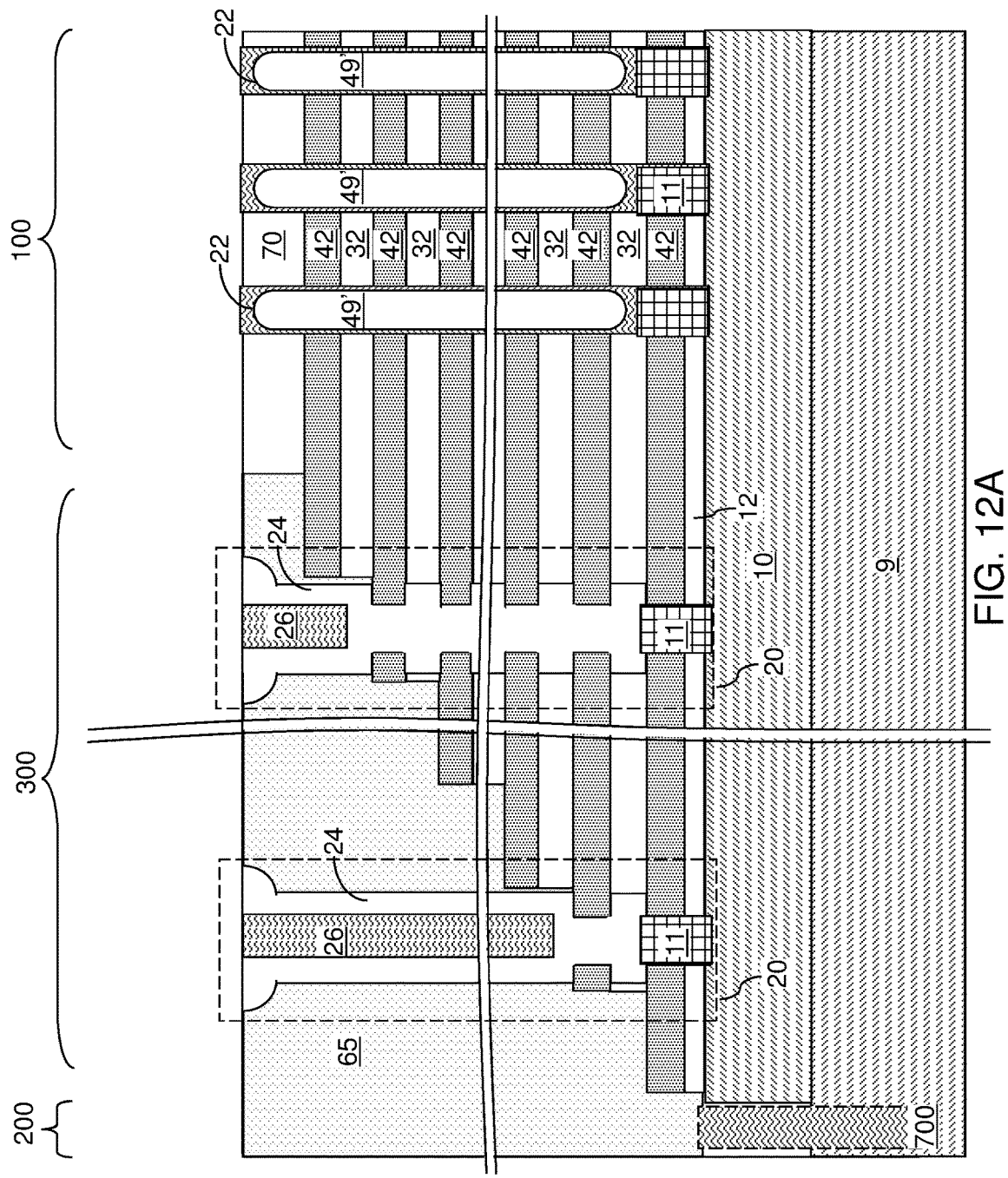
FIG. 12A is a schematic vertical cross-sectional view of the exemplary structure after formation of support pillar structures according to an embodiment of the present disclosure.
Figure 12B:
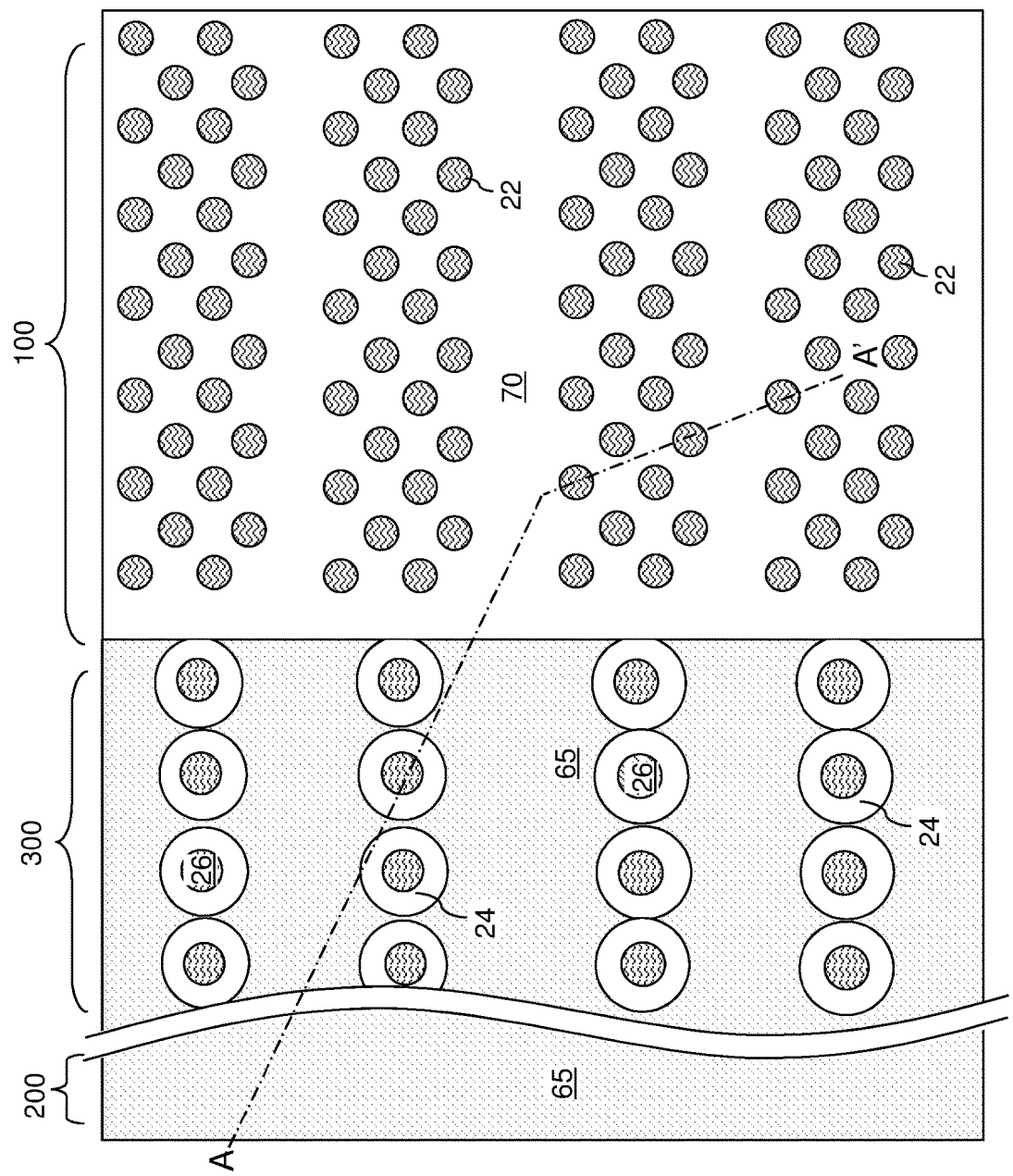
FIG. 12B is a top-down view of the exemplary structure of FIG. 12A. The vertical plane A-A' is the plane of the schematic vertical cross-sectional view of FIG. 12A.

Referring to FIGS. 12A and 12B, a planarization process can be performed to remove portions of the sacrificial fill material layer 26L, the dielectric fill material layer 24L, and the sacrificial cover material layer 22L from above the horizontal plane including the topmost surface of the retro-stepped dielectric material portion 65. Chemical mechanical planarization, a recess etch, or a combination thereof can be employed for the planarization process. The top surface of the insulating cap layer 70 and/or the top surface of the retro-stepped dielectric material portion 65 can be employed as a stopping surface for the planarization process.

Each remaining portion of the sacrificial fill material layer 26L within a support opening 39 constitutes a sacrificial fill material portion 26. Each remaining portion of the dielectric fill material layer 24L within a support opening 39 constitutes a fin-containing and cavity-containing dielectric pillar 24 that laterally surrounds and embeds a respective sacrificial fill material portion 26. In other words, a sacrificial fill material portion 26 fills a cavity 39' within a respective fin-containing and cavity-containing dielectric pillar 24. Each contiguous combination of a fin-containing and cavity-containing dielectric pillar 24, a sacrificial fill material portion 26, and an optional semiconductor pedestal 11 constitutes a support pillar structure 20. The support pillar structures 20 provide structural support during subsequent replacement of the sacrificial material layers 42 with electrically conductive layers. Each optional remaining portion of the sacrificial cover material layer 22L remaining within the memory openings 49 constitutes a sacrificial memory opening fill structure 22. Alternatively, the entire sacrificial cover material layer 22L is removed during the planarization process such that the memory openings 49 are exposed and no sacrificial memory opening structures 22 remain in the memory openings 49 after the planarization process.

Figure 13:
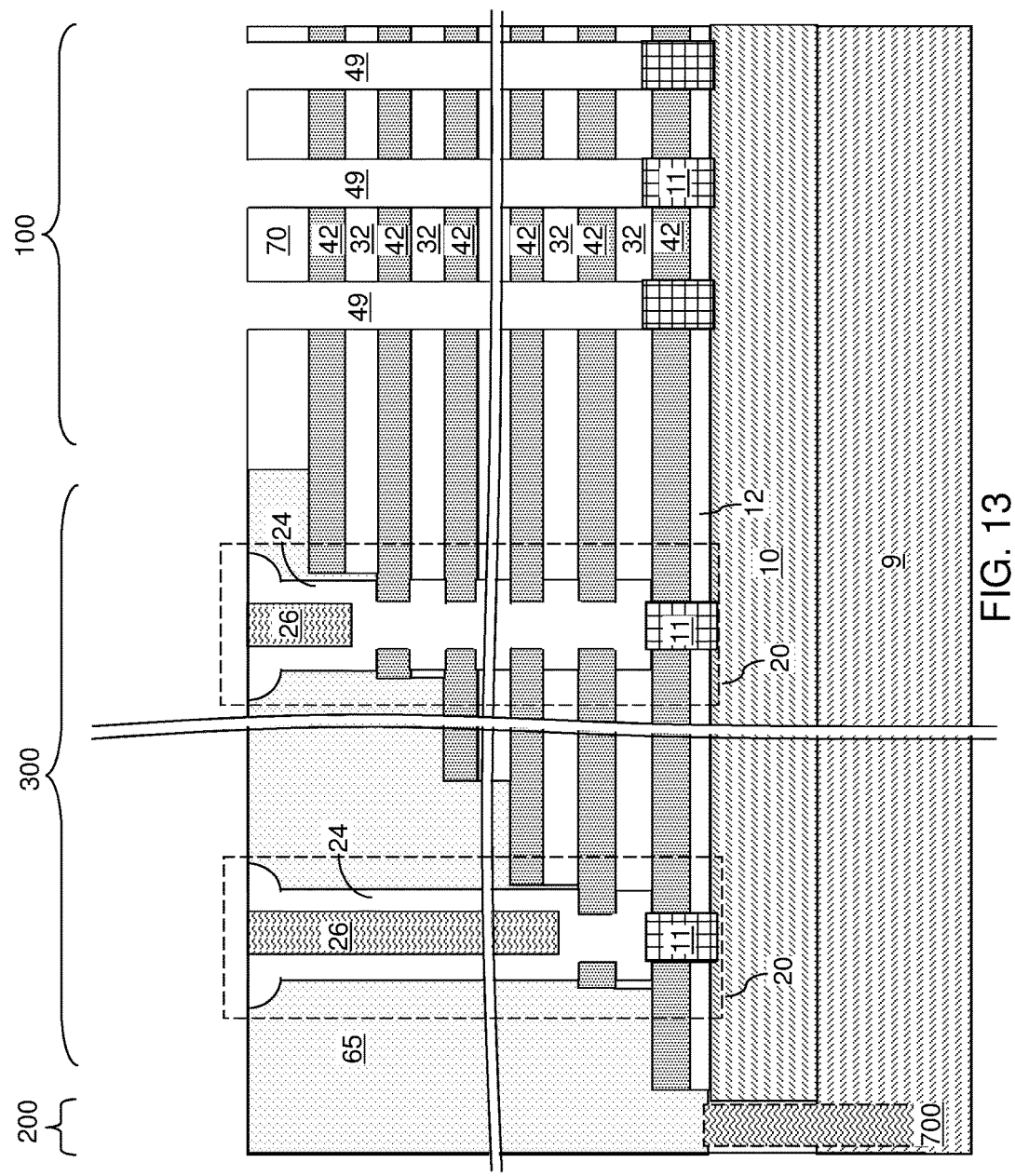
FIG. 13 is a schematic vertical cross-sectional view of the exemplary structure after removal of the material of the masking material layer which optionally remains inside the memory openings according to an embodiment of the present disclosure.

Referring to FIG. 13, if the sacrificial memory opening fill structures 22 remain in the memory openings 49 after the planarization process, then a subsequent etch process that etches the material of the sacrificial memory opening fill structures 22 selective to the materials of the insulating cap layer 70 and the alternating stack (32, 42) can be performed to remove the sacrificial memory opening fill structures 22. An isotropic etch or an anisotropic etch process may be employed to remove the sacrificial memory opening fill structures 22. The etch process that removes the sacrificial memory opening fill structures 22 can be selective to the dielectric materials of the retro-stepped dielectric material portion 65 and the fin-containing and cavity-containing dielectric pillars 24. The etch process that removes the sacrificial memory opening fill structures 22 may, or may not, be selective to the material of the sacrificial fill material portion 26. If the etch process that removes the sacrificial memory opening fill structures 22 is not selective to the material of the sacrificial fill material portion 26, a patterned masking layer (such as a patterned photoresist layer) may be employed to mask the contact region 300 during removal of the sacrificial memory opening fill structures 22.

The etch process that removes the sacrificial memory opening fill structures 22 may, or may not, be selective to the material of the semiconductor pedestals 11. In case the etch process that removes the sacrificial memory opening fill structures 22 is not selective to the material of the semiconductor pedestals 11, a timed etch process may be employed. For example, if the sacrificial memory opening fill structures 22 includes amorphous silicon or polysilicon and if the semiconductor pedestals 11 include epitaxial silicon, a timed etch can be employed to minimize collateral etching of the semiconductor pedestals 11. If the sacrificial memory opening fill structures 22 includes a different material (such as germanium, carbon, or a silicon-based polymer) than the semiconductor pedestals 11, the sacrificial memory opening fill structures 22 can be removed selective to the semiconductor pedestals 11. Each portion of the memory openings 49 that is not filled with the semiconductor pedestals 11 includes a respective void after removal of the sacrificial memory opening fill structures 22. If the sacrificial memory opening fill structures 22 do not remain in the memory openings 49 after the planarization process, then the subsequent etch process shown in FIG. 13 may be omitted.

Referring to FIG. 14A, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 14B, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the semiconductor pedestal 11 (or a surface of the semiconductor material layer 10 in case the semiconductor pedestals 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the semiconductor pedestal 11 (or of the semiconductor material layer 10 in case semiconductor pedestals 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 14C, a second semiconductor channel layer 602 can be deposited directly on the semiconductor surface of the semiconductor pedestal 11 or the semiconductor material layer 10 if the semiconductor pedestal 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 14D, in case the memory cavity 49' in each memory opening 49 is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 14E, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a semiconductor pedestal 11 (if present), a memory stack structure 55, a dielectric core 62, and a drain region 63 within a memory opening 49 is herein referred to as a memory opening fill structure (11, 55, 62, 63).

Figure 15:
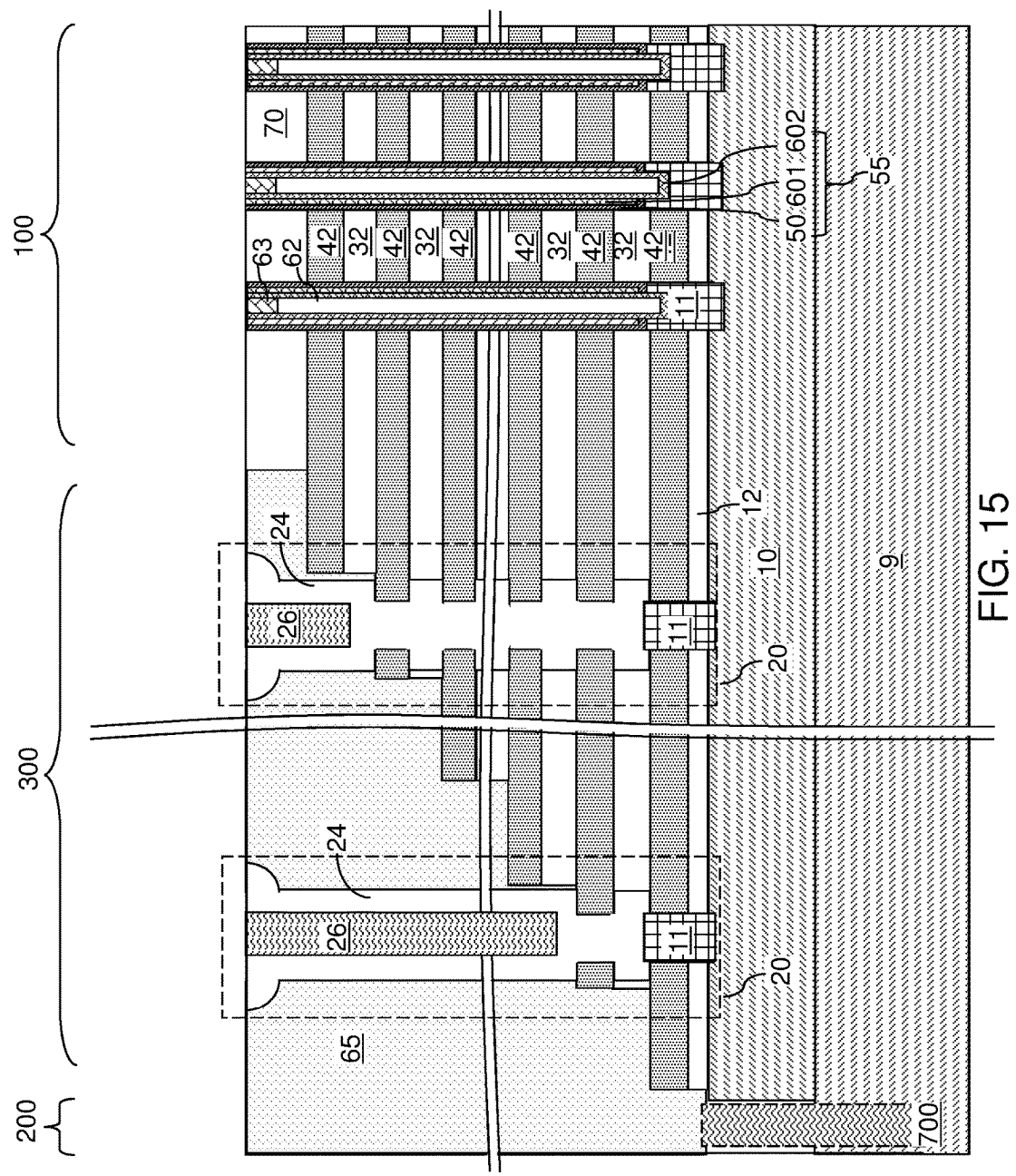
FIG. 15 is a schematic vertical cross-sectional view of the exemplary structure after formation of memory stack structures according to an embodiment of the present disclosure.

Referring to FIG. 15, the exemplary structure is illustrated after formation of memory opening fill structures (11, 55, 62, 63) and support pillar structure 20 within the memory openings 49 and the laterally expanded support openings 39, respectively. An instance of a memory opening fill structure (11, 55, 62, 63) can be formed within each memory opening 49 of the structure of FIG. 13.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 16A:
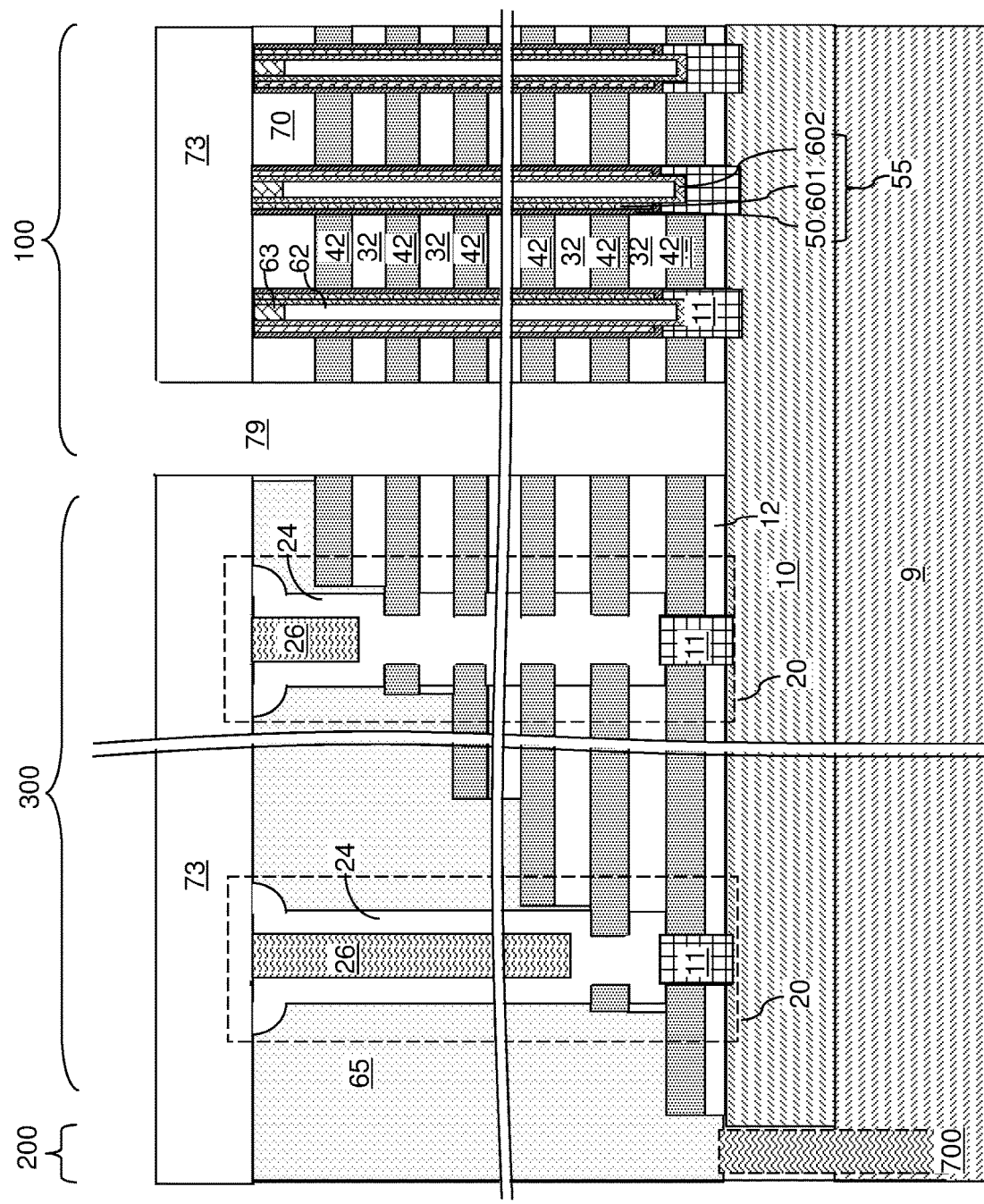
FIG. 16A is a schematic vertical cross-sectional view of the exemplary structure after formation of backside trenches according to an embodiment of the present disclosure.
Figure 16B:
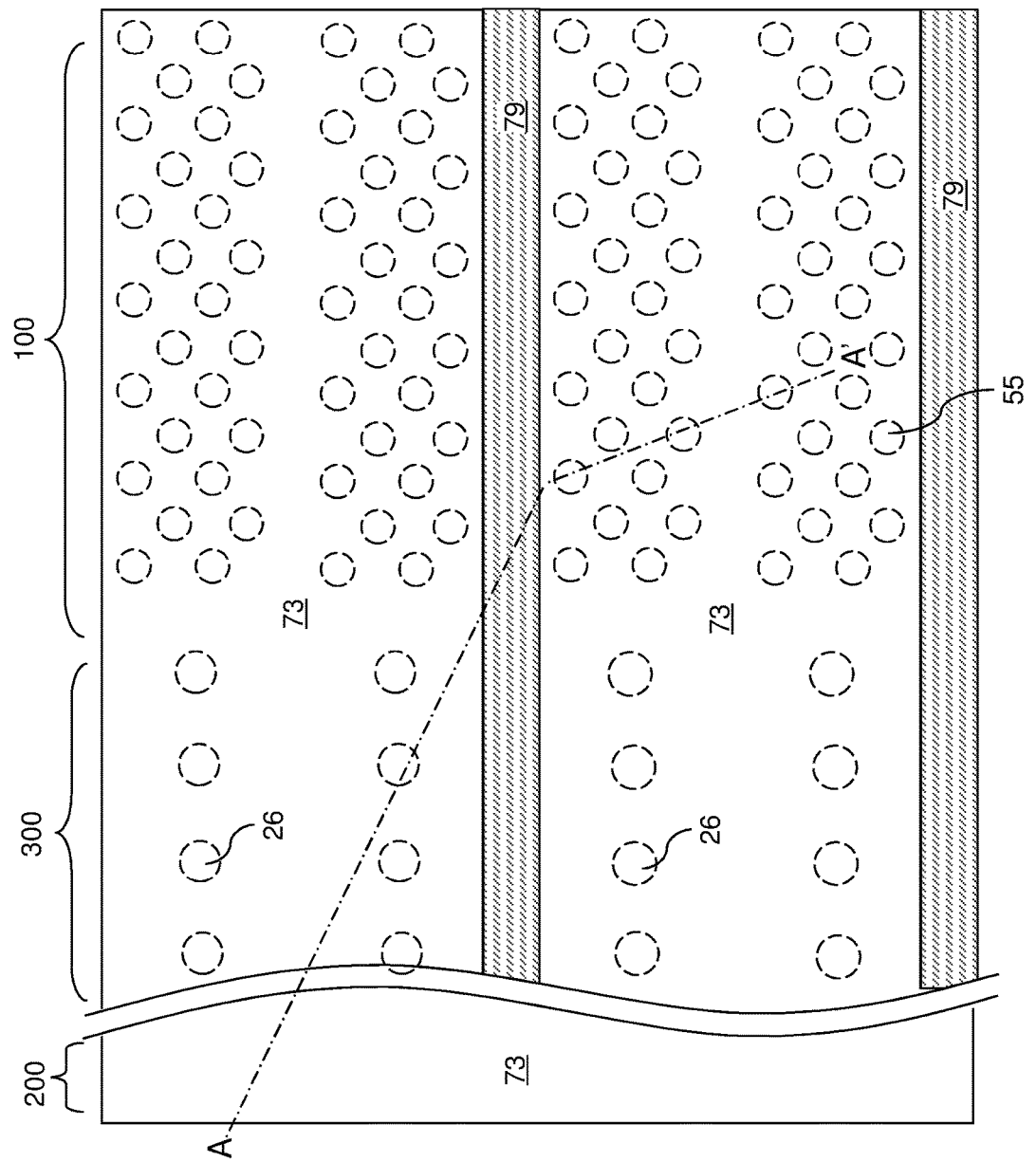
FIG. 16B is a partial see-through top-down view of the exemplary structure of FIG. 16A. The vertical plane A-A' is the plane of the schematic vertical cross-sectional view of FIG. 16A.

Referring to FIGS. 16A and 16B, a contact level dielectric layer 73 can be formed over the alternating stack (32, 42) of insulating layers 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 17:
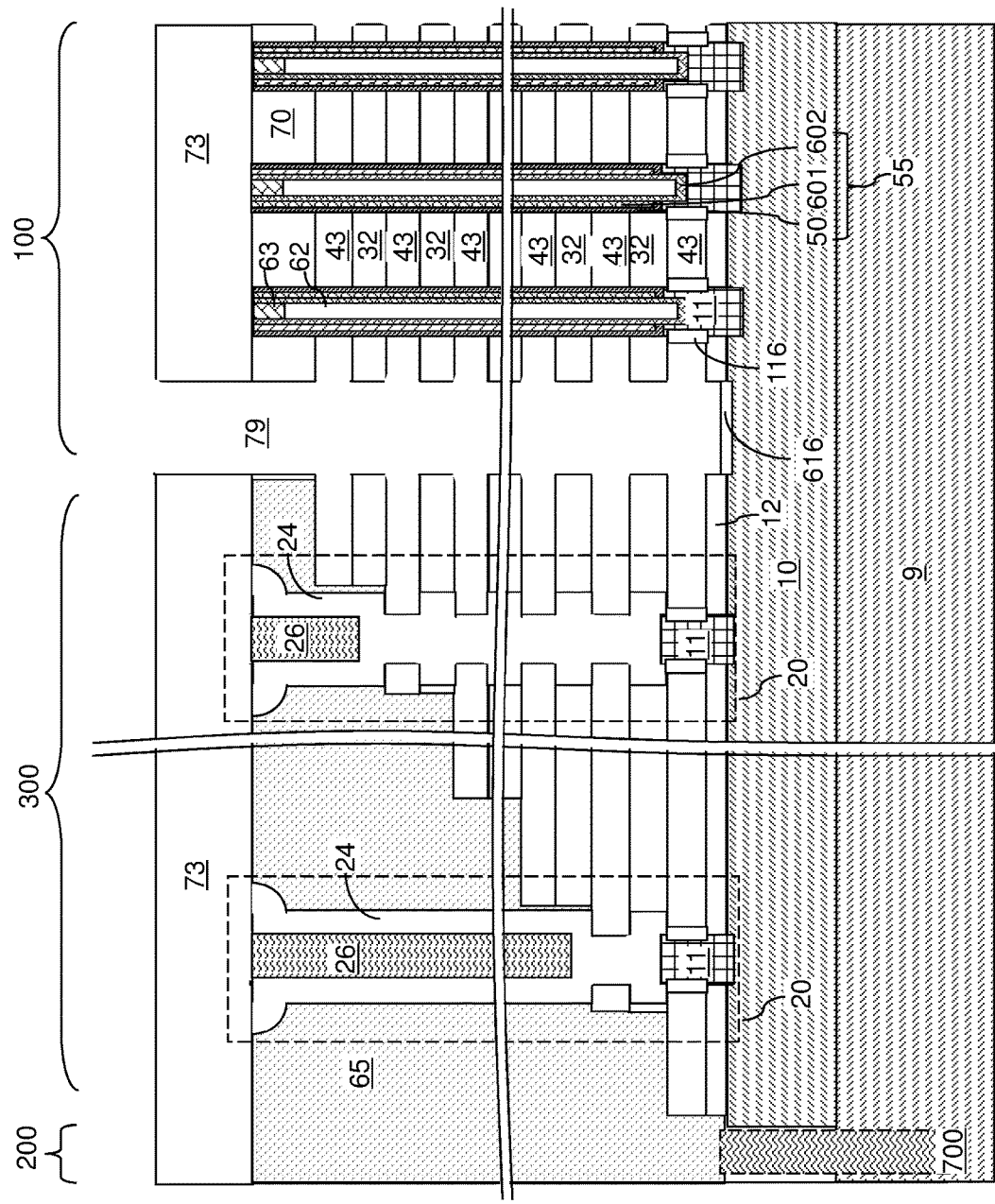
FIG. 17 is a schematic vertical cross-sectional view of the exemplary structure after formation of backside recesses according to an embodiment of the present disclosure.

Referring to FIGS. 17 and 18A, an etchant that selectively etches the second material of the sacrificial material layers 42 with respect to the first material of the insulating layers 32 and the insulating material of the fin-containing and cavity-containing dielectric pillars 24 can be introduced into the backside trenches 79, for example, employing an etch process. FIG. 18A illustrates a region of the exemplary structure of FIG. 17. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional semiconductor pedestals 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each semiconductor pedestal 11 into a tubular dielectric liner 116, and to convert each physically exposed surface portion of the semiconductor material layer 10 into a planar dielectric portion 616. In one embodiment, each tubular dielectric liner 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric liners 116 include a dielectric material that includes the same semiconductor element as the semiconductor pedestals 11 and additionally includes at least one non-metallic element such as oxygen and/or nitrogen such that the material of the tubular dielectric liners 116 is a dielectric material. In one embodiment, the tubular dielectric liners 116 can include a dielectric oxide, a dielectric nitride, or a dielectric oxynitride of the semiconductor material of the semiconductor pedestals 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 18B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric liners 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The thickness of the backside blocking dielectric layer 44 can be in a range from 1 nm to 10 nm, although lesser and greater thicknesses can also be employed. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 18C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 19:
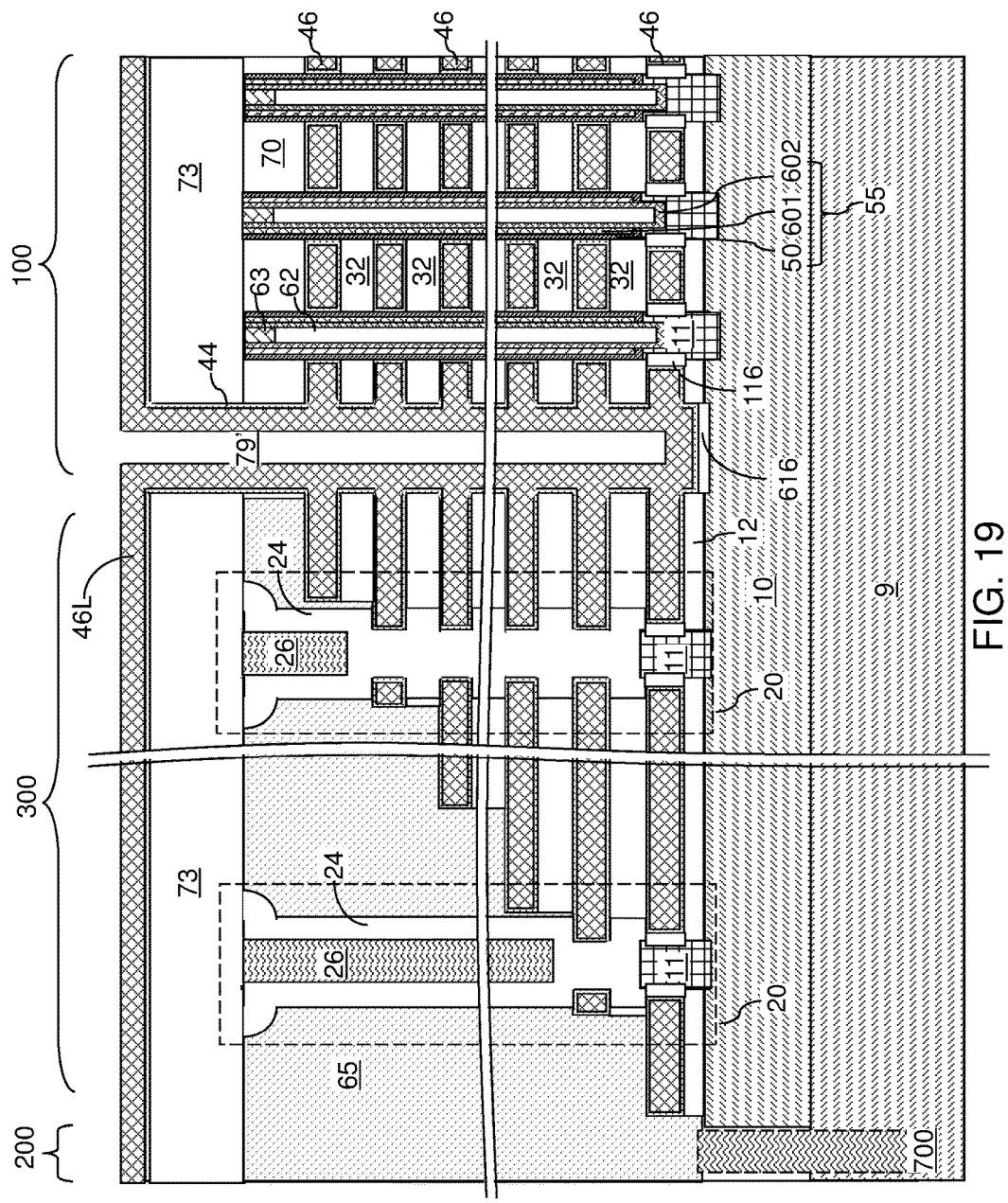
FIG. 19 is a schematic vertical cross-sectional view of the exemplary structure at the processing step of FIG. 18D.

Referring to FIGS. 18D and 19, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as WF6. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric liner 116 laterally surrounds a semiconductor pedestal 11. A bottommost electrically conductive layer 46 laterally surrounds each tubular dielectric liner 116 upon formation of the electrically conductive layers 46.

Figure 20:
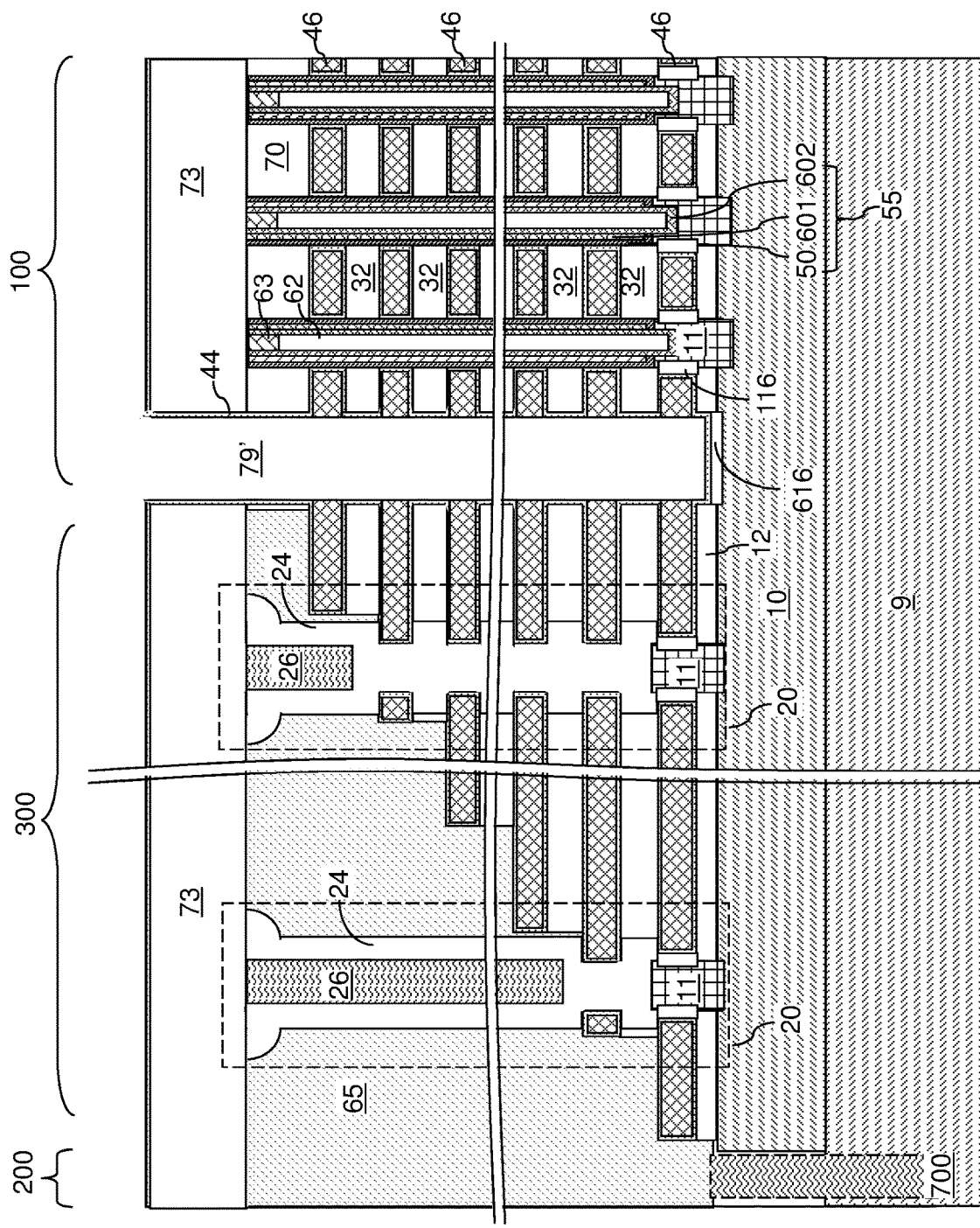
FIG. 20 is a schematic vertical cross-sectional view of the exemplary structure after removal of a deposited conductive material from within the backside trench according to an embodiment of the present disclosure.

Referring to FIG. 20, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. A backside cavity 79' is present within each backside trench 79.

Figure 21A:
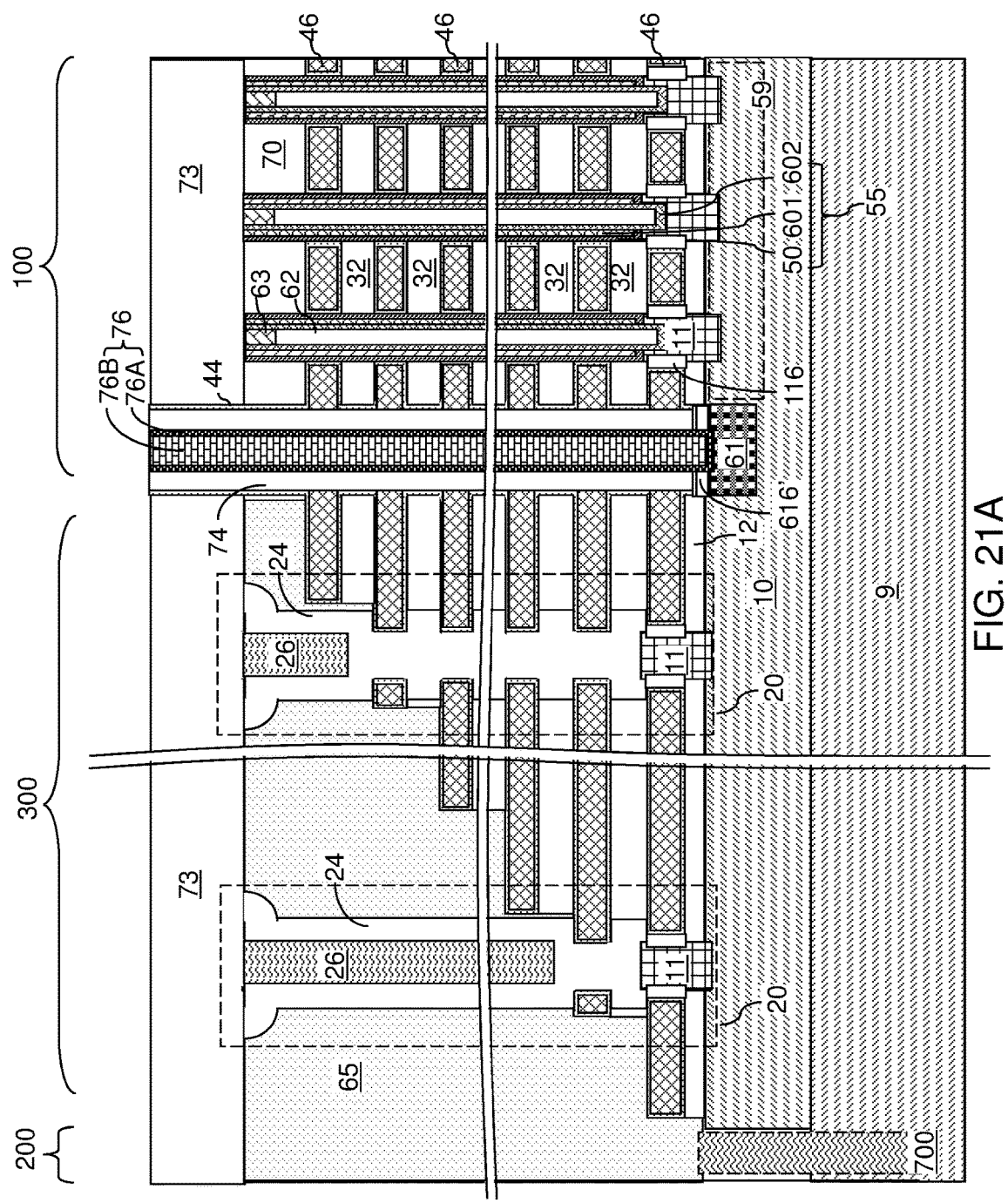
FIG. 21A is a schematic vertical cross-sectional view of the exemplary structure after formation of an insulating spacer and a backside contact structure according to an embodiment of the present disclosure.

Referring to FIGS. 21A and 21B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of semiconductor pedestals 11 constitutes a horizontal semiconductor channel 59 for a plurality of field effect transistors. The horizontal semiconductor channel 59 is connected to multiple vertical semiconductor channels 60 through respective semiconductor pedestals 11. The horizontal semiconductor channel 59 contacts the source region 61 and the plurality of semiconductor pedestals 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 22:
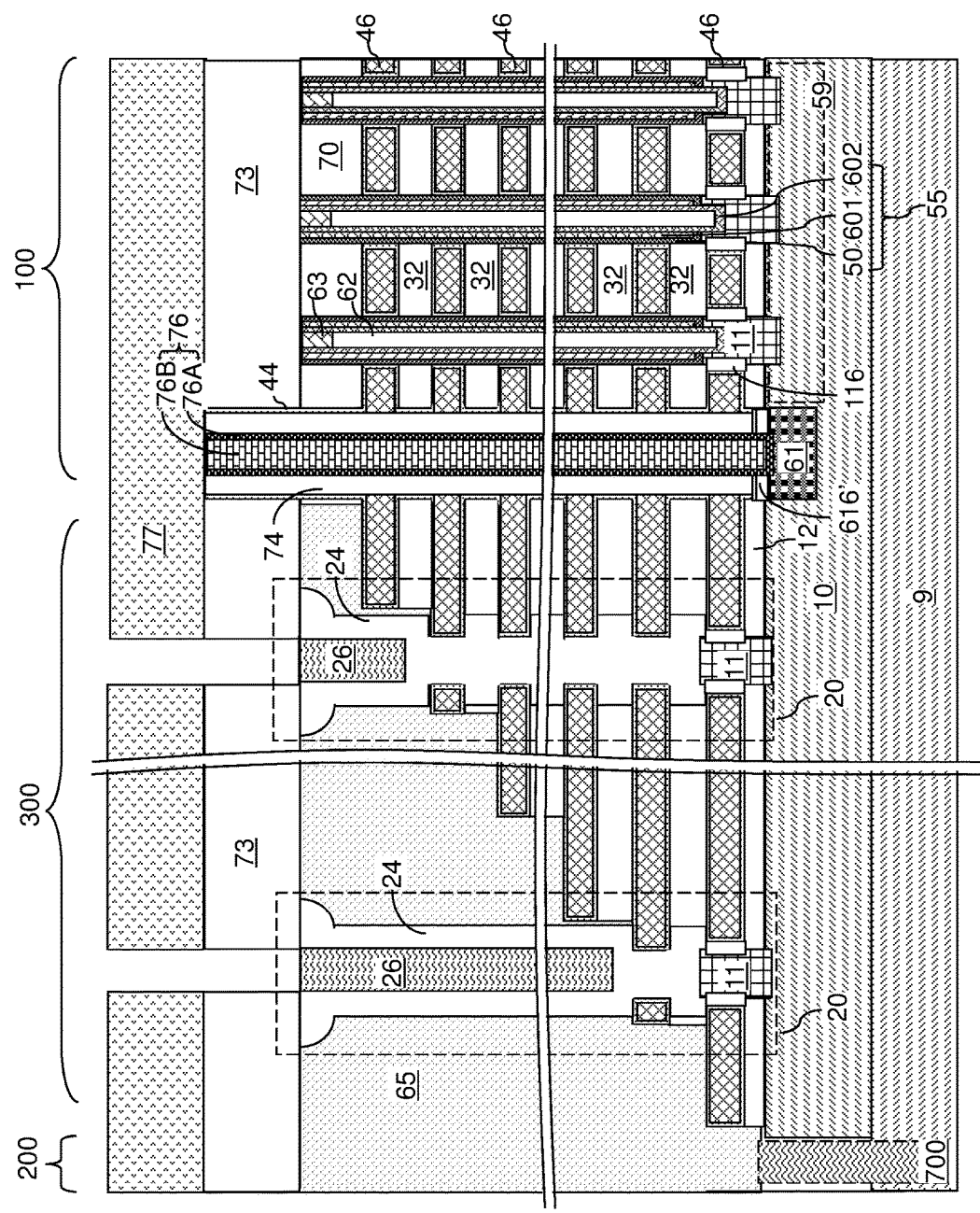
FIG. 22 is a schematic vertical cross-sectional view of the exemplary structure after formation of openings through a contact level dielectric layer according to an embodiment of the present disclosure.

Referring to FIG. 22, a photoresist layer 77 can be applied over the contact level dielectric layer 73, and can be lithographically patterned to form openings over each of the support pillar structures 20. The size and position of each opening through the photoresist layer 77 can be selected such that the area of each opening in the photoresist layer 77 overlaps with the area of an underlying sacrificial fill material portion 26. In one embodiment, at least 70% of the area of each opening in the photoresist layer 77 can overlap with the area of an underlying sacrificial fill material portion 26. The area of each opening in the photoresist layer 77 can be the same as, smaller than, or larger than, the area of the underlying sacrificial fill material portion 26. An anisotropic etch is subsequently performed to transfer the pattern of the openings in the photoresist layer 77 through the contact level dielectric layer 73.

Figure 23:
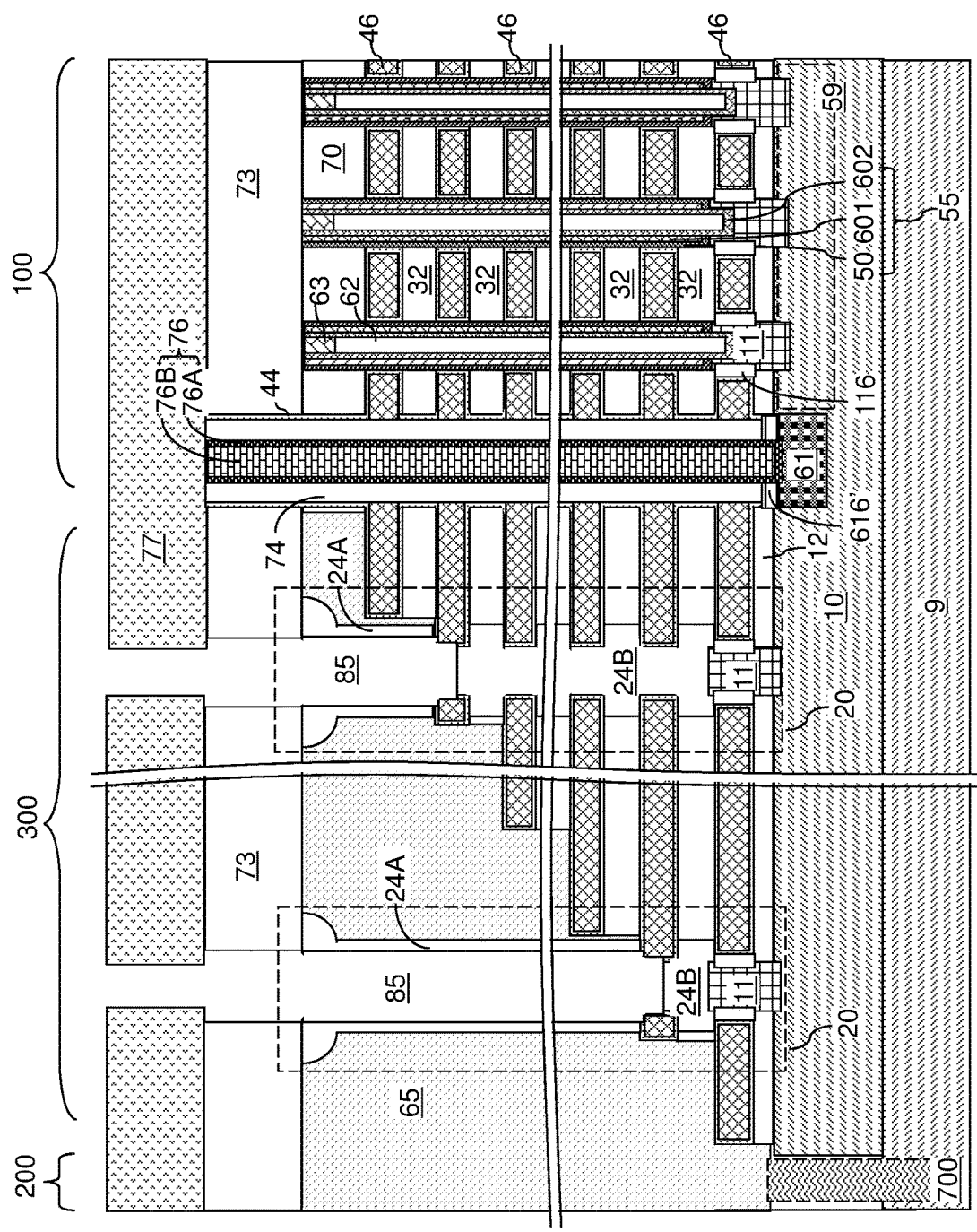
FIG. 23 is a schematic vertical cross-sectional view of the exemplary structure after removal of sacrificial fill material portions and recessing of fin-containing dielectric pillars according to an embodiment of the present disclosure.

Referring to FIG. 23, an etch process can be performed to remove the sacrificial fill material portions 26 selective to the material of the fin-containing and cavity-containing dielectric pillars 24. For example, if the sacrificial fill material portions 26 include a semiconductor material and if the fin-containing and cavity-containing dielectric pillars 24 include silicon oxide, an isotropic etch process or an anisotropic etch process that etches the semiconductor material selective to silicon oxide can be employed to remove the sacrificial fill material portions 26. Contact cavities 85 are formed within the fin-containing and cavity-containing dielectric pillars 24 by removal of the sacrificial material portions 26.

The contact cavities 85 can be subsequently expanded by removing surface portions of the fin-containing and cavity-containing dielectric pillars 24. Specifically, the material of the fin-containing and cavity-containing dielectric pillars 24 can be recessed by an etch process to vertically extend the contact cavity 85 to the level of a top electrically conductive layer 46 that underlies the contact cavity 85. An anisotropic etch process can be employed to vertically recess the contact cavities 85 within the support pillar structures 20. Optionally, the contact cavities 85 can be laterally recessed, collaterally with the vertical recessing of the contact cavities 85 or by an isotropic etch process, to widen the lateral dimensions of the contact cavities 85.

Each fin-containing and cavity-containing dielectric pillar 24 includes a fin-containing dielectric pillar 24B portion and a tubular dielectric liner 24A portion. Each tubular dielectric liner 24A vertically extends from a top surface of a horizontal portion of the backside blocking dielectric layer 44 to the horizontal plane including the top surface of the retro-stepped dielectric material portion 65. Each fin-containing dielectric pillar 24B vertically extends from below the bottom surface of a respective contact cavity 85 to a top surface of a respective semiconductor pedestal 11 (or to a top surface of the semiconductor material layer 10 in case semiconductor pedestals 11 are not formed).

In one embodiment, the top surface of each fin-containing dielectric pillar 24B can be recessed at least partly through an opening in the top electrically conductive layer 46 underneath a horizontal bottom surface of the retro-stepped dielectric material portion 65. In this case, the bottommost surface of the contact cavities 85, after vertical extension and optional lateral extension of the contact cavities 85, can be located between a horizontal plane including the top surface of the top electrically conductive layer 46 that underlies the respective contact cavity 85 and another horizontal plane including the top surface of another electrically conductive layer 46 that immediately underlies the top electrically conductive layer 46 (or the horizontal plane including the top surface of the substrate (9, 10) in case only a single electrically conductive layer 46 is present below a contact cavity 85).

Backside dielectric layer 44 can be physically exposed over the top surface and optionally, on the sidewalls of the top electrically conductive layer 46 that underlies each contact cavity 85. The physically exposed portions of the backside dielectric layer 44 can be removed, for example, by an isotropic etch process (such as a wet etch process). An annular top surface of a respective electrically conductive layer 46 can be physically exposed underneath each of the contact cavities 85. Further, sidewalls of the respective electrically conductive layer 46, which are located within an opening through the respective electrically conductive layer 46, can be physically exposed to a respective contact cavity 85. If desired, the exposed portions of the metallic barrier layer (e.g., a TiN layer) 46A can also be removed to expose the metallic fill material layer (e.g., a W layer) 46.

Figure 24:
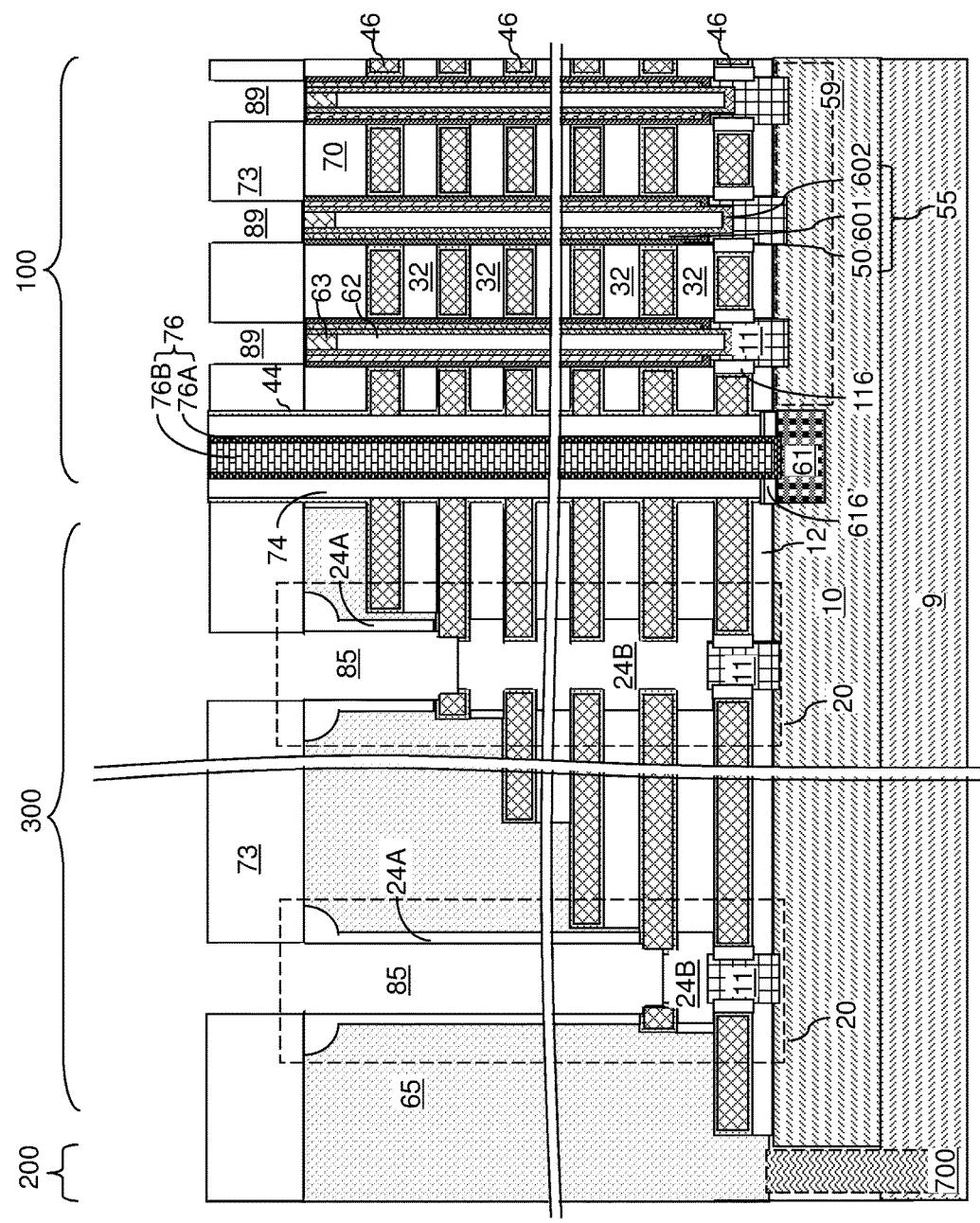
FIG. 24 is a schematic vertical cross-sectional view of the exemplary structure after formation of array contact via cavities according to an embodiment of the present disclosure.

Referring to FIG. 24, the photoresist layer 77 may be subsequently removed, for example, by ashing. Another photoresist layer (not shown) can be applied over the contact level dielectric layer 73, and can be lithographically patterned to form openings overlying the memory stack structures 55. Memory contact via cavities 89 can be formed through the contact level dielectric layer 73 to expose the drain regions 63 by transfer of the pattern in the photoresist layer into the contact level dielectric layer 73, for example, by an anisotropic etch. The photoresist layer can be subsequently removed, for example, by ashing.

Figure 25A:
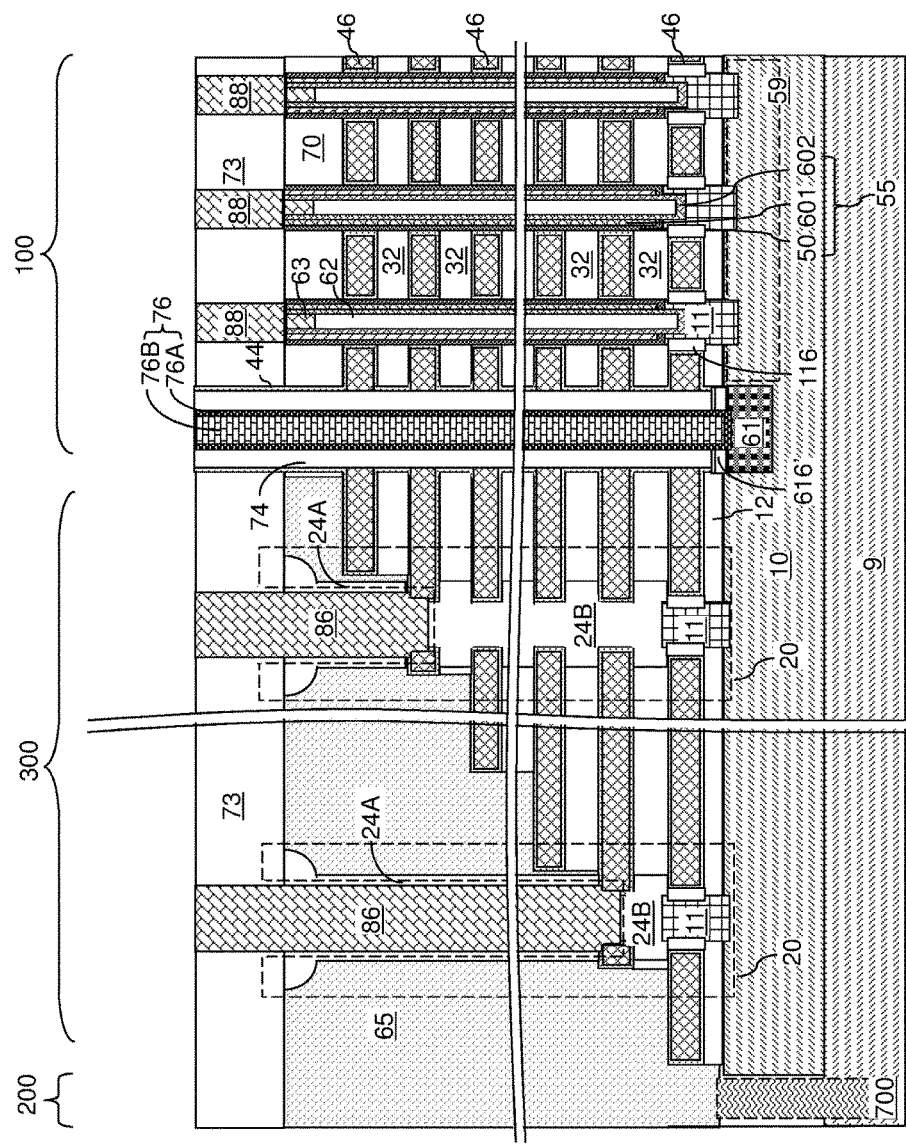
FIG. 25A is a schematic vertical cross-sectional view of the exemplary structure after formation of contact via structures according to an embodiment of the present disclosure.
Figure 25B:
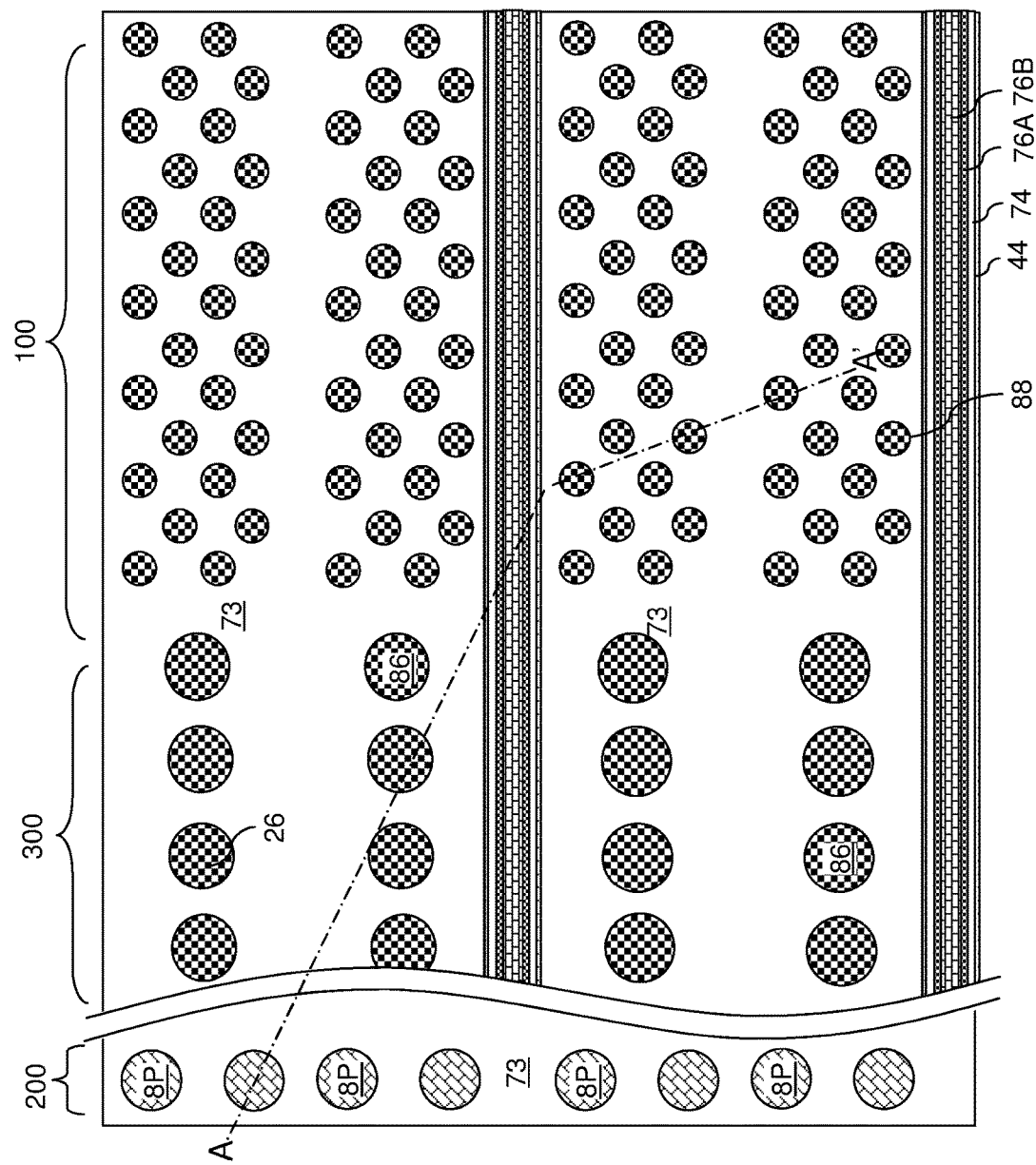
FIG. 25B is a top-down view of the exemplary structure of FIG. 25A. The vertical plane A-A' is the plane of the schematic vertical cross-sectional view of FIG. 25A.

Referring to FIGS. 25A and 25B, at least one conductive material can be deposited in the contact cavities 85 and the memory contact via cavities 89. The at least one conductive material can include, for example, a conductive metal nitride material (such as TiN, TaN, or WN) and a fill metal (such as W, Cu, Al, Co, Ru, or a combination thereof). Excess portions of the at least one conductive material can be removed from above the top surface of the contact level dielectric layer 73, for example, by a planarization process.

Each remaining portion of the at least one conductive material in the contact cavities 85 constitutes a contact via structure 86. The contact via structures 86 can include word line contact via structures that physically contact an annular top surface and sidewalls of a respective electrically conductive layer 46 that functions as a word line of a three-dimensional memory device. The sidewall of the respective electrically conductive layer 46 can be located within an opening through the respective electrically conductive layer 46. Each remaining portion of the at least one conductive material in the memory contact via cavities 89 constitutes a drain contact via structure 88 that contacts a respective drain region 63.

Each contiguous set of a contact via structure 86 and a support pillar structure 20 constitutes an integrated support and contact structure (20, 86), which provide combined functions of a contact via structure and a support pillar structure that are provided as two discrete structures laterally spaced from each other in prior art structures. Thus, each integrated support and contact structure (20, 86) includes a tubular dielectric liner 24A that laterally surrounds and contacts the contact via structure 86, a fin-containing dielectric pillar 24B, and an optional semiconductor pedestal 11. The contact via structure 86 contacts a top surface of a respective one of the electrically conductive layers 46. The fin-containing dielectric pillar 24B underlies, and contacts, the respective contact via structure 86 and includes a respective dielectric fin 24F that laterally protrudes outward at each level of one or more underlying insulating layers 32 that underlies a horizontal plane including a bottom surface of the contact via structure 86. The total number of dielectric fins 24F within each fin-containing dielectric pillar 24B can be the same as the total number of levels of the insulating layers between the bottom surface of the overlying contact via structure 86 and the underlying semiconductor pedestal 11.

The method of the embodiments of the disclosures provides at least one integrated support and contact structure (20, 86). The integrated support and contact structure has a smaller lateral size than separate support pillars and contact via structures in prior art devices. This reduces the device size and the size of the terrace region. Furthermore, separate photolithography and alternating stack etching steps to form contact via openings are not required. This reduces the process complexity and cost. This also reduces the chance of punch-through and short circuit during fabrication of the contact via structures.

The exemplary structure of the present disclosure can include a three-dimensional memory device. The three-dimensional memory device includes: an alternating stack of insulating layers 32 and electrically conductive layers 46 located over a substrate (9, 10); memory stack structures 55 extending through the alternating stack (32, 42), wherein each of the memory stack structures 55 comprises a memory film 50 and a vertical semiconductor channel 60 contacting an inner sidewall of the memory film 50; and at least one integrated support and contact structure (20, 86).

In one embodiment, the tubular dielectric liner 24A and the fin-containing dielectric pillar 24B can comprise the same dielectric material. In one embodiment, a top surface of the fin-containing dielectric pillar 24B can contact the bottom surface of the contact via structure 86.

In one embodiment, the respective one of the electrically conductive layers 46 can include an opening therethrough, and the contact via structure 86 can contact an upper portion of a sidewall of the respective one of the electrically conductive layers 46 inside the opening. In one embodiment, the fin-containing dielectric pillar 24B can contact a lower portion of a sidewall of the respective one of the electrically conductive layers 46 inside the opening.

In one embodiment, the three-dimensional memory device can include a terrace region including stepped surfaces of the alternating stack (32, 46), and a retro-stepped dielectric material portion 65 overlying the terrace region. The tubular dielectric liner 24A can be laterally surrounded by the retro-stepped dielectric material region 65. In one embodiment, the tubular dielectric liner 24A includes a flaring region that protrudes outward with a convex sidewall that adjoins an underlying vertically extending region. A top surface of the tubular dielectric liner 24A can be coplanar with a top surface of the retro-stepped dielectric material portion 65.

In one embodiment, each electrically conductive layer 46 other than a topmost electrically conductive layer 46 within the alternating stack (32, 46) can laterally extend farther than any overlying electrically conductive layer 46 within the alternating stack in the terrace region. The terrace region can include stepped surfaces of the alternating stack (32, 46) that continuously extend from a bottommost layer within the alternating stack (32, 46) to a topmost layer within the alternating stack (32, 46). At least one integrated support and contact structure (20, 86) can extend through a respective horizontal portion of the stepped surfaces.

In one embodiment, each one of the memory stack structures 55 can contact a top surface of a respective instance of a semiconductor pedestal 11, and the fin-containing dielectric pillar 24B can contact an additional instance of the semiconductor pedestal 11.

In one embodiment, the three-dimensional memory structure can further include a backside blocking dielectric layer 44 disposed between each neighboring pair of an electrically conductive layer 46 and an insulating layer 32 and extending from a bottommost layer within the alternating stack (32, 46) to a topmost layer within the alternating stack (32, 46). The fin-containing dielectric pillar 24B can be laterally spaced from a subset of the electrically conductive layers 46 underlying the electrically conductive layer 46 that the contact via structure 86 contacts by the backside blocking dielectric layer 44.

In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   memory stack structures extending through the alternating stack, wherein each of the memory stack structures comprises a memory film and a vertical semiconductor channel contacting an inner sidewall of the memory film; and
   at least one integrated support and contact structure, wherein each of the at least one integrated support and contact structure includes:
      a contact via structure contacting a top surface of a respective one of the electrically conductive layers;
      a tubular dielectric liner that laterally surrounds the contact via structure; and
      a fin-containing dielectric pillar underlying the respective contact via structure and including a respective dielectric fin that laterally protrudes outward at each level of one or more underlying insulating layers that underlies a horizontal plane including a bottom surface of the contact via structure.

2. The three-dimensional memory device of claim 1, wherein the tubular dielectric liner and the fin-containing dielectric pillar comprise a same dielectric material.

3. The three-dimensional memory device of claim 1, wherein a top surface of the fin-containing dielectric pillar contacts the bottom surface of the contact via structure.

4. The three-dimensional memory device of claim 1, wherein:
   the respective one of the electrically conductive layers includes an opening therethrough; and
   the contact via structure contacts an upper portion of a sidewall of the respective one of the electrically conductive layers inside the opening.

5. The three-dimensional memory device of claim 4, wherein the fin-containing dielectric pillar contacts a lower portion of a sidewall of the respective one of the electrically conductive layers inside the opening.

6. The three-dimensional memory device of claim 1, further comprising:
   a terrace region including stepped surfaces of the alternating stack; and
   a retro-stepped dielectric material portion overlying the terrace region,
   wherein the tubular dielectric liner is laterally surrounded by the retro-stepped dielectric material region.

7. The three-dimensional memory device of claim 6, wherein:
   the tubular dielectric liner includes a flaring region that protrudes outward with a convex sidewall that adjoins an underlying vertically extending region; and
   a top surface of the tubular dielectric liner is coplanar with a top surface of the retro-stepped dielectric material portion.

8. The three-dimensional memory device of claim 6, wherein:
   each electrically conductive layer other than a topmost electrically conductive layer within the alternating stack laterally extends farther than any overlying electrically conductive layer within the alternating stack in the terrace region;
   the terrace region includes stepped surfaces of the alternating stack that continuously extend from a bottommost layer within the alternating stack to a topmost layer within the alternating stack; and
   the at least one integrated support and contact structure extends through a respective horizontal portion of the stepped surfaces.

9. The three-dimensional memory device of claim 1, wherein:
   each one of the memory stack structures contacts a top surface of a respective instance of a semiconductor pedestal; and
   the fin-containing dielectric pillar contacts an additional instance of the semiconductor pedestal.

10. The three-dimensional memory device of claim 1, further comprising a backside blocking dielectric layer disposed between each neighboring pair of an electrically conductive layer and an insulating layer and extending from a bottommost layer within the alternating stack to a topmost layer within the alternating stack, wherein the fin-containing dielectric pillar is laterally spaced from a subset of the electrically conductive layers by the backside blocking dielectric layer.

11. The three-dimensional memory device of claim 1, wherein:
   the three-dimensional memory device comprises a monolithic three-dimensional NAND memory device;
   the electrically conductive layers comprise, or are electrically connected to, a respective word line of the monolithic three-dimensional NAND memory device;
   the substrate comprises a silicon substrate;
   the monolithic three-dimensional NAND memory device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon;
   the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *